United States Patent [19]

Yamada et al.

[11] Patent Number: 5,455,415
[45] Date of Patent: Oct. 3, 1995

[54] INSOLATION SENSOR

[75] Inventors: Manabu Yamada, Anjo; Yutaka Maeda, Takahama; Masaya Nakamura, Nagoya; Makoto Shirai, Yokkaichi, all of Japan

[73] Assignee: Nippondenso Co., Ltd., Kariya, Japan

[21] Appl. No.: 110,821

[22] Filed: Aug. 24, 1993

[30] Foreign Application Priority Data

Aug. 25, 1992 [JP] Japan .................................. 4-226035
Jul. 15, 1993 [JP] Japan .................................. 5-175094

[51] Int. Cl.$^6$ ................................................ H01J 40/14
[52] U.S. Cl. ......................... 250/214.1; 257/434
[58] Field of Search ............................ 257/434, 435, 257/459, 53; 250/214.1

[56] References Cited

FOREIGN PATENT DOCUMENTS

| 56-064611 | 6/1981 | Japan . | |
| 1229372 | 10/1986 | Japan | 257/53 |
| 62-071713 | 4/1987 | Japan . | |
| 3278284 | 11/1988 | Japan | 257/459 |

*Primary Examiner*—William L. Sikes
*Assistant Examiner*—James A. Dudek
*Attorney, Agent, or Firm*—Cushman, Darby & Cushman

[57] ABSTRACT

An insolation sensor for detecting a substantial insolation direction from the sun including a light shading film an aperture defined therein and provided on one of the surfaces of a glass substrate. A position detection element having a photoelectric conversion film made of a semiconductor is formed on the other surface. The rays of light from the sun are incident as a spot beam H onto the position detection element through the aperture. The position detection element detects a center of the intensity of photocurrent at the beam receiving portion. Therefore, even when the intensity of each of the direct rays and scattered rays from the sun change on the ground depending on the weather conditions, the center position of the distribution of the insolation intensity can be detected in accordance with the weather conditions, and a substantial insolation direction can be detected.

23 Claims, 18 Drawing Sheets

BEAM INCIDENT DIRECTION

INSOLATION SENSOR

BACKGROUND OF THE INVENTION

1. Field of the Invention

This invention relates to an insolation sensor for detecting an insolation receiving direction.

2. Description of the Related Art

Incidence of solar rays into the inside of a car where air conditioning is being utilized in the car, etc., is unavoidable. Therefore, to enable air conditioning control that takes into consideration the temperature rise resulting from the incidence of solar rays into the car, it has been customary to detect an insolation quantity and to correct and control a blow-out quantity of air and an air flow rate of an air conditioner in accordance with the detected insolation quantity.

Comfort inside the air conditioning space has been increasing in recent years, and attempts have been made to detect an incident direction of solar rays and to control air conditioning inside a car with good balance on the basis of the detection result in order to more finely control air conditioning.

A sensor for detecting the insolation direction of the solar rays is described, for example, in Japanese Unexamined Patent Publication (Kokai) No. 56-64611. According to this prior art technique, the solar rays are concentrated into a spot beam through a pin-hole and are then allowed to be incident onto a light reception surface of a charge coupled device (CCD), and an electrical detection signal corresponding to the light reception position is obtained. A signal processing circuit processes this detection signal on the basis of a geometric positional relationship between the light reception position detected and the pin-hole so as to detect the position of the sun.

Using such a sensor, the air conditioner mounted in a car can correct the air conditioning condition with good balance inside the car on the basis of the detection data of the position of the sun, that is, its direction and altitude. Consequently, comfort inside the air-conditioning space can be improved.

An insolation sensor for use in air conditioning must determine a substantial center position of the insolation of the solar rays in accordance with the change of weather conditions but not the actual position of the sun. In other words, the insolation from the sun received on the ground includes not only direct rays but also scattered rays due to clouds, etc., in the sky. Among these, the direct rays come from a direction corresponding to the actual position of the sun, but the scattered rays come from many directions irrespective of the position of the sun.

Accordingly, when the weather is fine with hardly any clouds in the sky, the quantity of the scattered solar rays becomes small. In other words, the components of the direct rays are predominant and the components of the scattered rays are so small that they can be substantially neglected. As the quantity of clouds becomes greater, however, the intensity of the components of the direct rays becomes lower, while the components of the scattered rays become greater. Accordingly, a case occurs where the main direction of insolation from the sun is different from the actual direction of the sun in accordance with the weather conditions. On the other hand, the air conditioning condition inside the car is affected not only by the direct rays of the sun but also by the scattered rays as they both raise the internal temperature of the car. For this reason, it is of importance in air conditioning control to detect the direction of the main insolation.

However, the prior art structure described above is not yet free from the following drawbacks. FIG. 21(a) of the accompanying drawings shows the detection principle using a CCD 21, and an explanation will be given briefly of the case of unidirectional detection. A light shading film 23 is disposed on a light reception surface 22 of the CCD 21 with a predetermined gap between them, and a pin-hole 24 is bored at a position of this light shading film 23 corresponding to the center of the light reception surface 22. When the CCD 21 receives a beam incident through the pin-hole 24 on the light reception surface 22, a charge is stored at the light reception position. The charge thus stored in the CCD 21 is taken out as an electrical signal corresponding to the light reception position by a signal processing circuit, and this circuit outputs a digital signal of an "H" level or an "L" level depending on whether or not this electrical signal is above a predetermined level.

When the weather is fine and the solar rays are received at this time, the intensity of the direct rays is high. Accordingly, the distribution state of the rays received by and obtained from the light reception surface 22 of the CCD 21 can be obtained as the detection signal relying almost solely on the direct rays. Accordingly, the incident direction of the solar rays can be detected as the center position of the detection signal.

When clouds exist in the sky and the weather is cloudy, the solar rays reaching the ground consist almost solely of the scattered solar rays. Accordingly, the scattered rays are incident to the position immediately below the pin-hole 24 on the light reception surface 22 of the CCD 21. In this case, since the ground substantially receives the scattered rays of the solar rays, the insolation direction can be detected from the center position of the scattered rays. See FIG. 21(d).

When the quantity of clouds is not so great and the weather is slightly cloudy, the scattered rays are incident with a certain insolation intensity into the CCD 21 together with the direct solar rays. In this case, the direct rays are incident into the position of the light reception surface 22 of the CCD 21 in accordance with the direction of the sun, while the scattered rays are incident into the position immediately below the pin-hole 24. However, under the slightly cloudy condition, the intensity of the direct rays becomes weaker and the difference from the intensity of the scattered rays becomes small and cannot be neglected.

Accordingly, if the direct rays and scattered rays of the solar rays are incident into the light reception surface 22 of the CCD 21 when the weather is slightly cloudy, a light reception detection signal is output in a region shown in FIG. 21(c) in accordance with the light reception intensities. As a result, when the center position of the light reception position is determined from the light reception signal obtained as a digital signal, the resulting center position is greatly deviated from the actual light reception center of the direct rays as well as from the actual insolation direction.

As described above, the prior art structure detects the position of received solar rays from a digital signal using the CCD 21. Accordingly, it fails to detect not only the position of the sun but also the substantial insolation direction in accordance with the change of the weather condition, and when the detection result is used for insolation correction in air conditioning control, the detection data of the insolation quantity and the insolation direction cannot enable accurate correction processing.

SUMMARY OF THE INVENTION

In view of the problems with the prior art sensors described above, the present invention aims at providing an insolation sensor which, though having a compact structure, can detect a main insolation direction and an intensity thereof, in accordance with weather conditions, and can execute an accurate correction processing in an air conditioning control system, for example, on the basis of a main insolation direction.

An insolation sensor according to the present invention comprises light shading means for transmitting only a beam which is incident onto a predetermined region, and a position detection element for photoelectrically converting the beam incident onto a light reception surface spaced apart by a predetermined distance from this light shading means and outputting an electrical signal corresponding to a two-dimensional light reception position and a light reception intensity, so as to detect the intensity of the solar rays incident onto the light reception surface of the position detection element through the light shading means as well as a central position in its two-dimensional intensity distribution.

According to the insolation sensor of the present invention, the solar rays are incident onto the light reception surface of the position detection element through the light shading means and at this time, the direct solar rays are incident onto the position of the light reception surface corresponding to the direction of the sun, while the scattered solar rays are incident particularly strongly onto the position immediately below the light shading means on the light reception surface irrespective of the direction of the sun.

When the weather is fine with hardly any clouds in the sky, the intensity of the direct solar rays is high and the intensity of the scattered rays can be almost neglected. Therefore, the light reception position detected by the position detection element is the position which corresponds to the reception position of the direct rays, that is, the position corresponding to the direction of the sun. In this case, the insolation on the ground is substantially that of the direct rays. Accordingly, the light reception position from the position detection element can be utilized as the substantial insolation receiving direction.

When the quantity of clouds in the sky is great and the weather is cloudy, the solar rays are almost cut off by the clouds, and the direct intensity of the direct rays can be substantially neglected in comparison with the intensity of the scattered rays. Therefore, the components of the light incident onto the portion immediately below the light shading means become predominant on the light reception surface of the position detection element. Accordingly, the light reception position detected by the position detection element is the position receiving the scattered rays, that is, the position directly above. In this case, the insolation on the gound is substantially that of the scattered rays from the sun, and the light reception position from the position detection element can be utilized as the direction receiving the main insolation.

When the weather is slightly cloudy with a small quantity of clouds, both the direct rays and scattered rays are incident onto the light reception surface of the position detection element. At this time, the intensity of the scattered rays is also relatively high. Accordingly, both the direct rays and the scattered rays are received to an extent that they cannot be neglected. In this case, the position detection element outputs an electrical signal proportional to the intensity of the received rays. Accordingly, the position corresponding to the central position of the intensity distribution is detected as the light reception position. This light reception position is the main direction of the insolation which the ground receives from the sun. The intensity of the solar irradiation is represented by the current flowing through the detector.

DESCRIPTION OF THE PREFERRED EMBODIMENTS

Hereinafter, the first embodiment of the present invention, which is applied to an insolation sensor used for an automatic air conditioner of a car, will be explained with reference to FIGS. 1 to 11.

Figure 2:
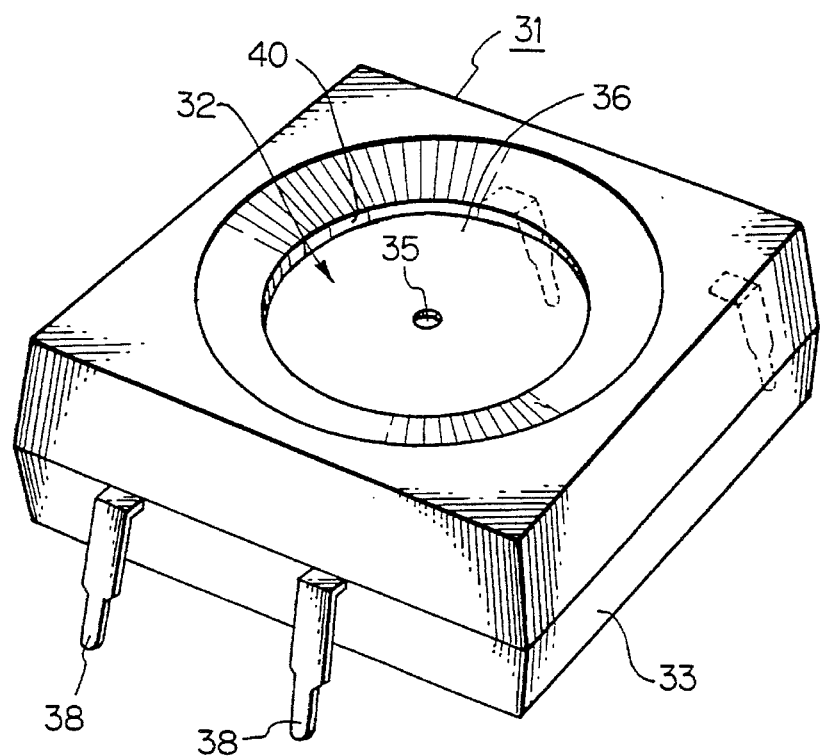
FIG. 2 is a perspective view showing the appearance of an insolation sensor.

FIG. 2 shows the appearance of an omnidirectional insolation sensor 31 as the object of the present invention. In FIG. 2, the insolation sensor 31 includes a photoelectric conversion device main body 32 and a rectangular resin package 33 for storing the main body 32 in a molded state. The photoelectric conversion device main body 32 includes a rectangular glass substrate 34, and a light shading film 36 having a pin-hole 35 (having a diameter of from about 0.5 to about 9 mm, for example) as a light transmission means is disposed at the center of the surface side of this glass substrate 34. A position detection element 37 for receiving a spot beam incident from the pin-hole 35 and outputting an electrical signal corresponding to the light reception position and a light reception quantity is disposed on the back of the glass substrate 34. Four lead frames 38 are disposed to as to extend from position detection element 37 while penetrating through the side wall portion of package 33.

Though the definite construction of this photoelectric conversion device main body 32 will be described later in detail, the shading film 36 is formed, for example, by directly printing an epoxy resin containing carbon black mixed therein on the surface of the glass substrate 34, or by depositing a thin metal film. Each lead frame 38 is bonded to each of four (in total) electrodes 39 (only three being shown in FIG. 4), of the position detection element 37 by an electrically conductive adhesive (such as an epoxy resin type adhesive containing a silver filler).

The package 33 described above is made of a black epoxy resin containing about 0.3 wt % of carbon black, for example, in mixture, and is provided with a light shading property. In this case, a filler such as molten silica is further mixed with the black epoxy resin in order to further reduce the difference of thermal expansion coefficients between the package 33 and the glass substrate 34 and the lead frame 38.

The package 33 covers the side surface portion of the glass substrate 34 and the position detection element 37 together with the bonded portions of the electrodes 39, and covers also the peripheral portion of the upper surface of the light shading film 36 in such a manner as to leave a round window portion 40 which is concentric with the pin-hole 35. In this case, the peripheral portion of the window portion 40 in the package 33 is shaped into a cone which gently declines towards the window portion 40 so that rays of light from a relatively low altitude can be incident into the pin-hole 35.

Figure 1:
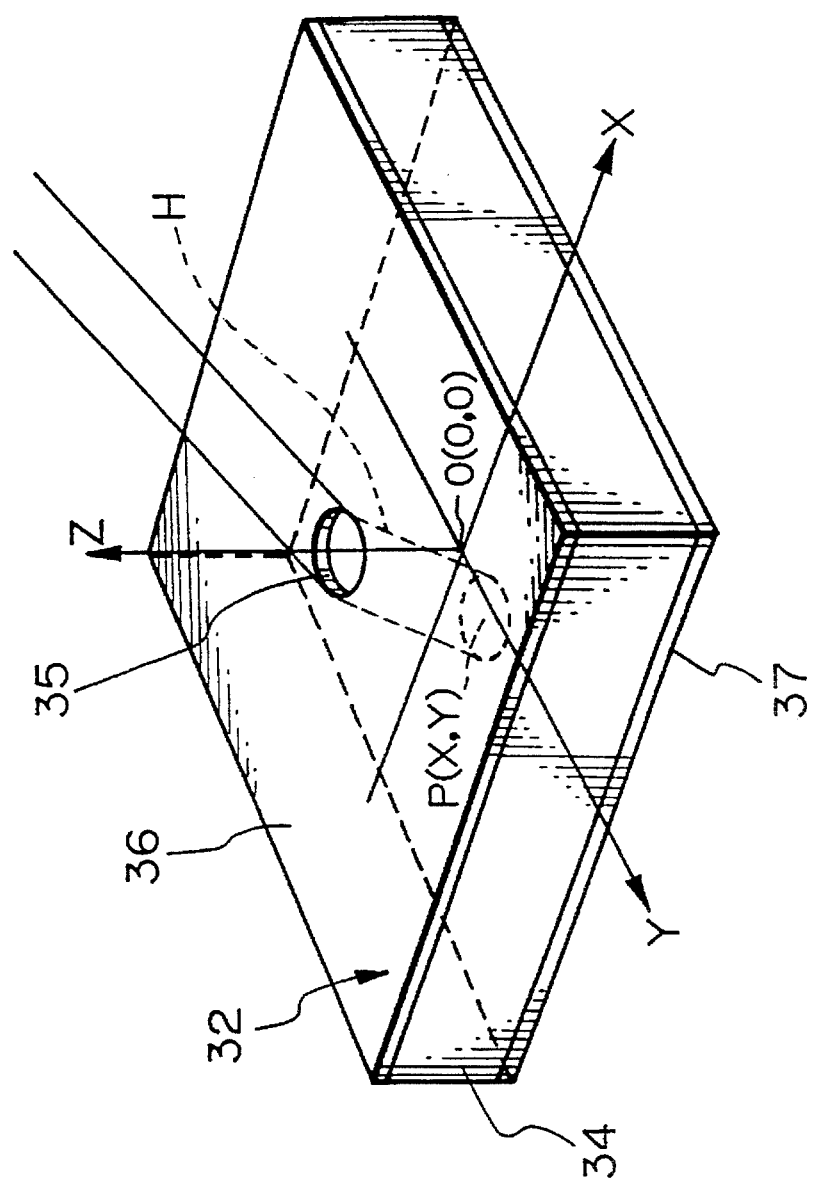
FIG. 1 is a perspective view showing schematically of a photoelectric conversion device main body of an insolation sensor according to the first embodiment of the present invention.
Figure 3:
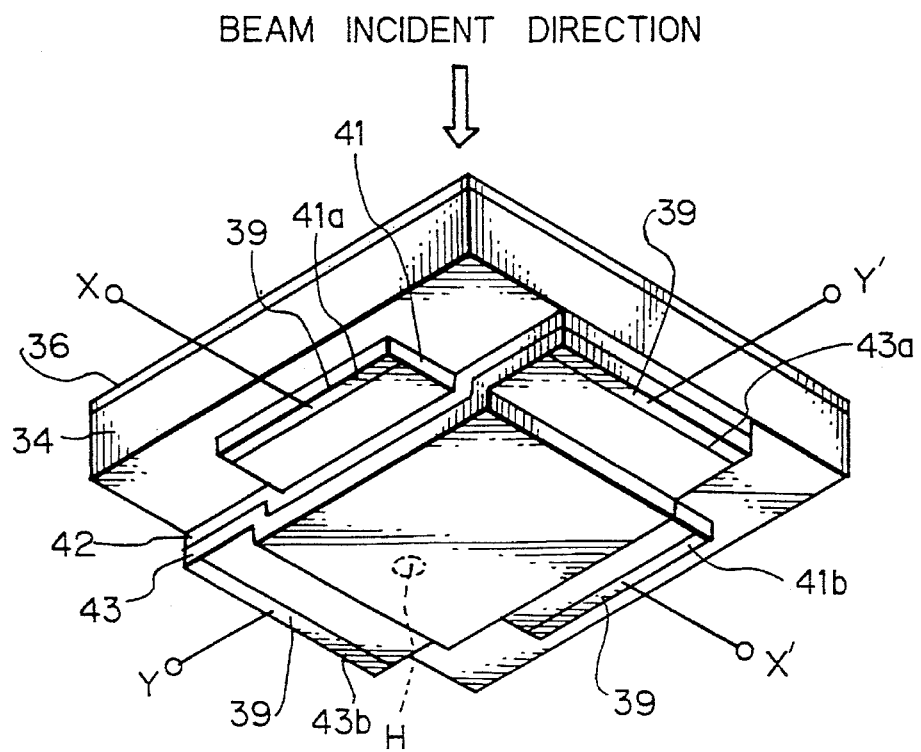
FIG. 3 is a perspective view from below showing a schematic structure of the photoelectric conversion device main body.
Figure 4:
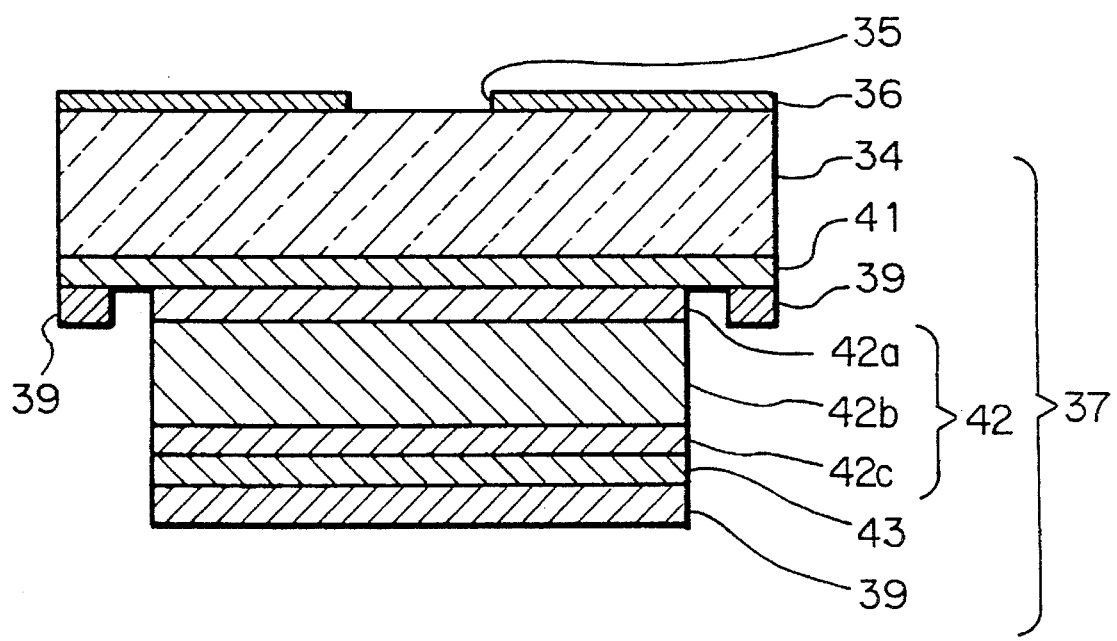
FIG. 4 is a sectional view schematically showing a layer structure of the photoelectric conversion device main body.

FIGS. 1 and 3 are perspective views showing the schematic construction of the photoelectric conversion device main body 32, and FIG. 4 is a schematic sectional view of a layer structure of the photoelectric conversion device main body 32.

In FIG. 3, the position detection element 37 of the photoelectric conversion device main body 32 is formed by sequentially laminating an X-direction resistor film 41 such as a photoelectric conversion film 42 utilizing amorphous silicon (hereinafter referred to as "a-Si") and a Y-direction resistor film 43 consisting of a metal electrode resistor on the back of the glass substrate 34, forming belt-like electrode members 41a, 41b and 43a, 43b having a lower resistance value than that of the resistor films 41 and 43 at both end portions of the X- and Y-direction resistor films 41 and 43, respectively, and extending a total of four lead electrodes X, X' and Y, Y' from these electrode members 41a, 41b and 43a, 43b, respectively. Incidentally, these belt-like electrodes 41a, 41b and 43a, 43b correspond to the electrodes 39 described above, and the lead electrodes X, X', Y, Y' similarly correspond to the lead frames 38 shown in FIG. 2, respectively.

In this embodiment, because the photoelectric conversion film 42 is interposed between the X-direction resistor film 41 and the Y-direction resistor film 43 that are disposed in a mutually orthogonal state, they do not come into direct contact with each other, and in a steady state (where rays of light are not incident), the resistor films 41 and 43 are substantially insulated from each other by the photoelectric conversion film 42.

Next, the material of each layer of the photoelectric conversion main body 32 and its detailed structure will be explained with reference to FIG. 4.

A soda glass plate having a thickness of about 1.8 mm and coated with $SiO_2$, for example, is used as the glass substrate 34.

The X-direction resistor film 41 is made of 60 nm-thick $SnO_2$ and has a sheet resistance value of 200 Ω/square. In this case, the functions required for the X-direction resistor film 41 are that it has light transmissibility and has a suitable sheet resistance value. Therefore, transparent electrode materials other than $SnO_2$, such as ZnO, ITO, etc., can be used for this film 41.

The sheet resistance value of the X-direction resistor film 41 is set to the range of from 10 Ω/square to 1 mΩ/square and preferably, from 100 Ω/square to 50 kΩ/square, because if the sheet resistance value of the X-direction resistor film 41 is too low, no difference between its resistance value and that of the electrode 39 exists and this resistor film 41 does not function as a resistor. If the sheet resistance value is too high, on the other hand, it is higher than the resistance value of the photoelectrical conversion film 42 when the rays of light are incident (about 1 KΩ to about 500 kΩ in the case of a-Si), and no output can be obtained.

An a-Si alloy film is laminated into a p-i-n structure on the X-direction resistor film 41 having the structure described above so as to form the photoelectric conversion film 42 having a diode structure. More definitely, as shown schematically in FIG. 4, the photoelectric conversion film 42 has a three-layered structure formed by sequentially laminating a p-type semiconductor layer 42a, made of a-SiC, an i-type semiconductor layer 42b, made of intrinsic a-Si and a n-type semiconductor layer 42c, made of a-Si from the direction of incidence of light (from the side of the X-direction resistor film 41), and this structure constitutes a photo-diode D. In this case, the thickness of the semiconductor layers 42a, 42b, and 42c, is set to 10 nm, 600 nm and 60 nm, for example, respectively. Incidentally, the photoelectric conversion film 42 can be formed by laminating the a-Si alloy film onto the n-i-p layer structure.

When a spot beam is irradiated onto this photoelectric conversion film 42, only the irradiated portion of the film generates a photocurrent due to electromotive force resulting from its photoelectric conversion function. This photocurrent flows in reverse with respect to the p-n junction, or in other words, it flows longitudinally from the n-type semiconductor 423 towards the p-type semiconductor 421 through the i-type semiconductor 422 at the irradiation position of the spot beam.

On the other hand, the Y-direction resistor film 43 is formed by an about 40 nm-thick Ti layer. This Y-direction resistor film 43 may fundamentally have the same structure as the X-direction resistor film 41. However, as can be seen from the structure shown in FIGS. 3 and 4, it does not at all need to permit the transmission of light therethrough. Accordingly, beside Ti or similar materials for the X-direction resistor film 41, metals such as Cr and Ni, TiN, Ag paste, Ni paste, Cu paste, etc., can also be used as the material of the Y-direction resistor film 43 so long as the sheet resistance value is at least 10 Ω/square and up to 1 MΩ/square.

Next, the operation of this embodiment will be explained with reference to FIGS. 5 to 11, in the order of (A) the principle of detection of the insolation direction and the altitude, (B) the principle of detection of the light reception point of the insolation sensor and (C) the detection operation of the insolation direction corresponding to a change in the weather.

(A) Detection Principle of Insolation Direction and Altitude

The detection principle of the insolation and the altitude by the photoelectric conversion device main body 32 of the insolation sensor 31 will be explained briefly. As shown in FIG. 1, the solar rays incident into the photoelectric conversion device main body 32 are concentrated to a spot beam by the pin-hole 35 and are incident onto the glass substrate 34 after being refracted. This incident spot beam H is received at the point P(x, y) on the position detection element 37. In this case, the position of the light reception point P corresponds to the direction of the solar rays and the altitude.

Figure 7:
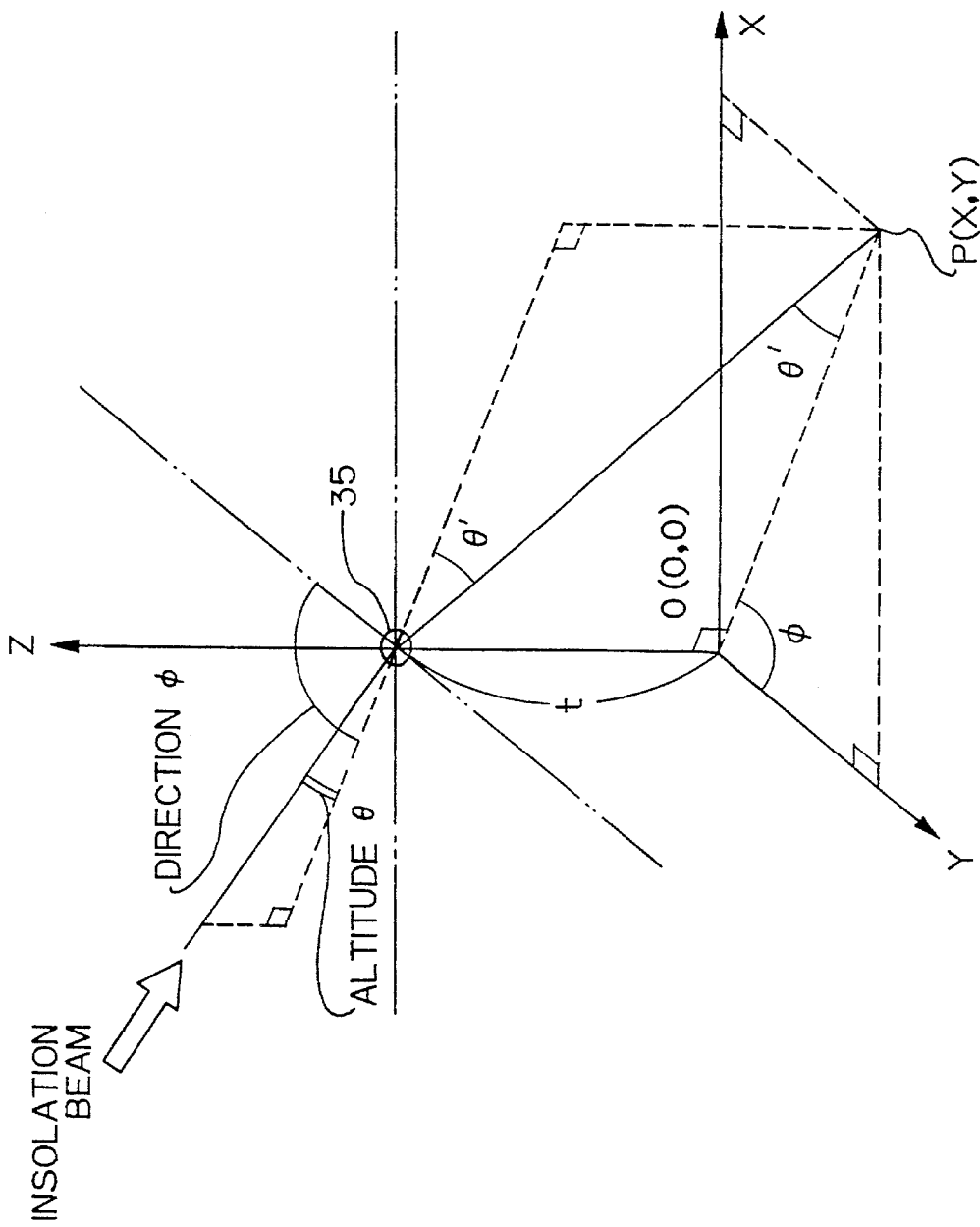
FIG. 7 is a three-dimensional coordinate diagram for explaining the principle for calculating of a direction and an altitude of insolation by the insolation detected sensor.

FIG. 7 shows the relationship between the pin-hole 35 and the light reception point P(x, y) by X, Y and Z three-dimensional coordinates axes in order to explain the detection principle of the insolation direction and the altitude. In this case, the origin O(0, 0) of the coordinates is set to a position immediately below the pin-hole 35 on the position detection element 37, the direction in which the lead electrodes X and X' of the X-direction resistor film 41 oppose each other is set to the X axis, the direction in which the lead electrodes Y and Y' of the Y-direction resistor film 43 oppose each other is set to the Y axis and the direction of thickness of the glass substrate 34 is set to the Z axis.

In FIG. 7, when the angle described between the insolation beam incident into the pin-hole 35 and the surface of the glass substrate 34 (i.e., π/2-angle of incidence), that is, the altitude of the insolation beam, is expressed by θ, then the angle described between the spot beam H incident onto the glass substrate 34 as a material having a high refractive index and the surface and back of the glass substrate 34 becomes θ'. In other words, the spot beam H reaches the point P(x, y) at the angle θ'.

Here, the angle between the Y axis on the position detection element 37 and the point P(x, y), that is, the direction φ of the insolation beam, is calculated in accordance with the following equation on the basis of the point(x, y):

when $x > 0$ and $y > 0$    $\phi = \tan^{-1}(x/y) = \pi$ when $x < 0$ and $y > 0$    $\phi = \tan^{-1}(x/y) + \pi$ when $y < 0$    $\phi = \tan^{-1}(x/Y)$ Assuming that the refractive index of air is 1 and that of the glass substrate 34 is n, then, the relationship between the incident angle β of the spot beam H incident onto the glass substrate 34 ($\beta = \pi/2 - \theta$) and its refection angle β' ($\beta' = \pi/2 - \theta'$) is generally expressed as follows:

$$\sin \beta / \sin \beta' = n$$

Accordingly, if the thickness of the glass substrate 34 is t, the altitude of the insolation ray, that is, θ ($=\pi/2-\beta$), can be calculated in accordance with the following equations (1) and (2) using the above-mentioned relational formula:

$$\beta = \tan^{-1}(A/\sqrt{|1-A^2|})$$

hence, $$\theta = \pi/2 - \beta \qquad (1)$$
$$= \pi/2 - \tan^{-1}(A/\sqrt{|1-A^2|})$$

however, $$A = n \cdot \sqrt{(x^2+y^2)/(x^2+y^2+t^2)} \qquad (2)$$

However, since the center position of the spot beam H changes with the thickness of the light shading film 36 in which the pin-hole 35 is bored, in practice, the following equation (3) incorporating a correction term α is utilized:

$$A = n \cdot \sqrt{(x^2+y^2)/(x^2+y^2+t^2+\alpha)} \qquad (3)$$

On the other hand, the photocurrent Io generated at the point p(x, y) receiving the beam in the position detection element 37 is proportional to the intensity S of insolation, as will become more apparent from a later-appearing explanation. In this case, because the practical altitude of the insolation ray is θ, the quantity of light passing through the pin-hole 35 changes in accordance with this altitude 8. Accordingly, the photocurrent Io changes in accordance with the relationship given below with respect to the intensity S of insolation:

$Io = S \cdot \sin \theta$ Accordingly, the intensity S of the insolation can be determined from this relational formula as follows:

$S = Io/\sin \theta$

In practice, however, the change curve of the photocurrent io with the altitude θ of the insolation ray does not coincide with a sine curve due to surface reflection on the glass substrate 34, and so forth. Accordingly, the following correction formula is employed (where each of a, b, c, d, e and f represents a constant):

$$S = Io/(a\theta^5 + b\theta^4 + c\theta^3 + d\theta^2 + e\theta + f) \qquad (4)$$

Figure 8:
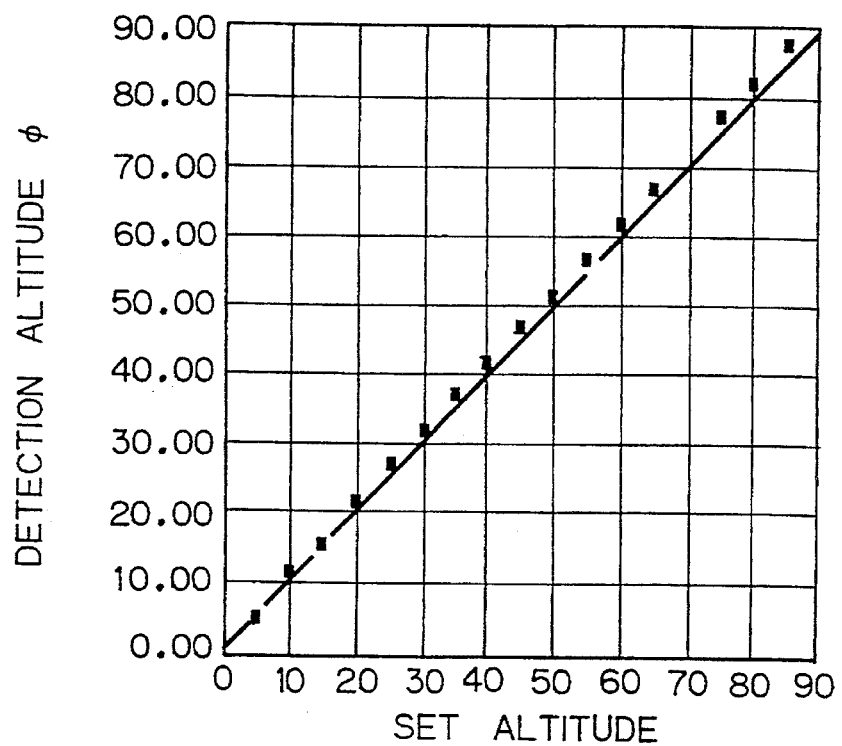
FIG. 8 is a diagram showing altitude detection characteristics of incident light received by the position sensor element.
Figure 9:
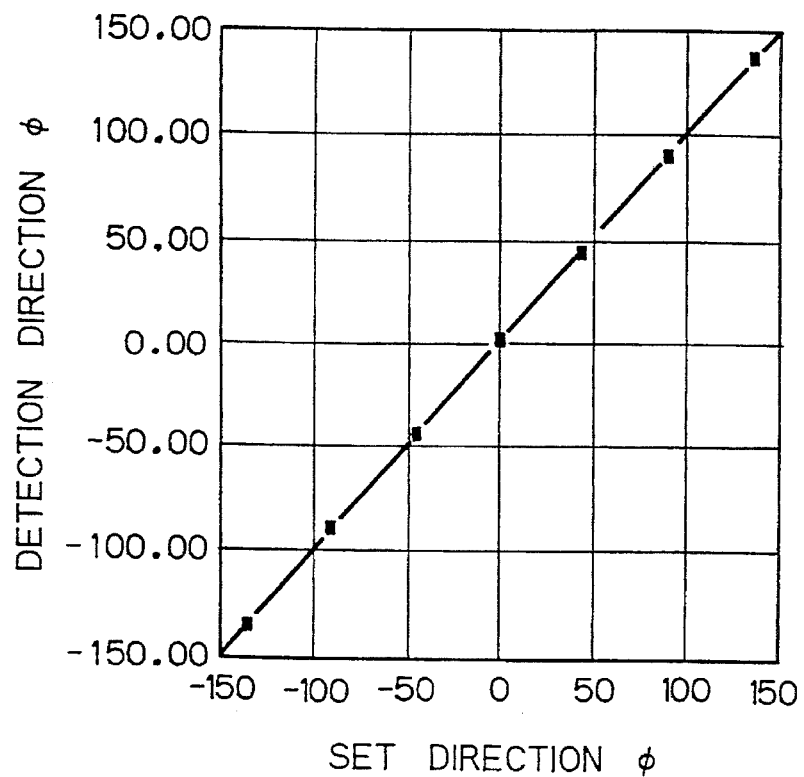
FIG. 9 is a diagram showing direction detection characteristics of incident light received by the position sensor element.
Figure 10:
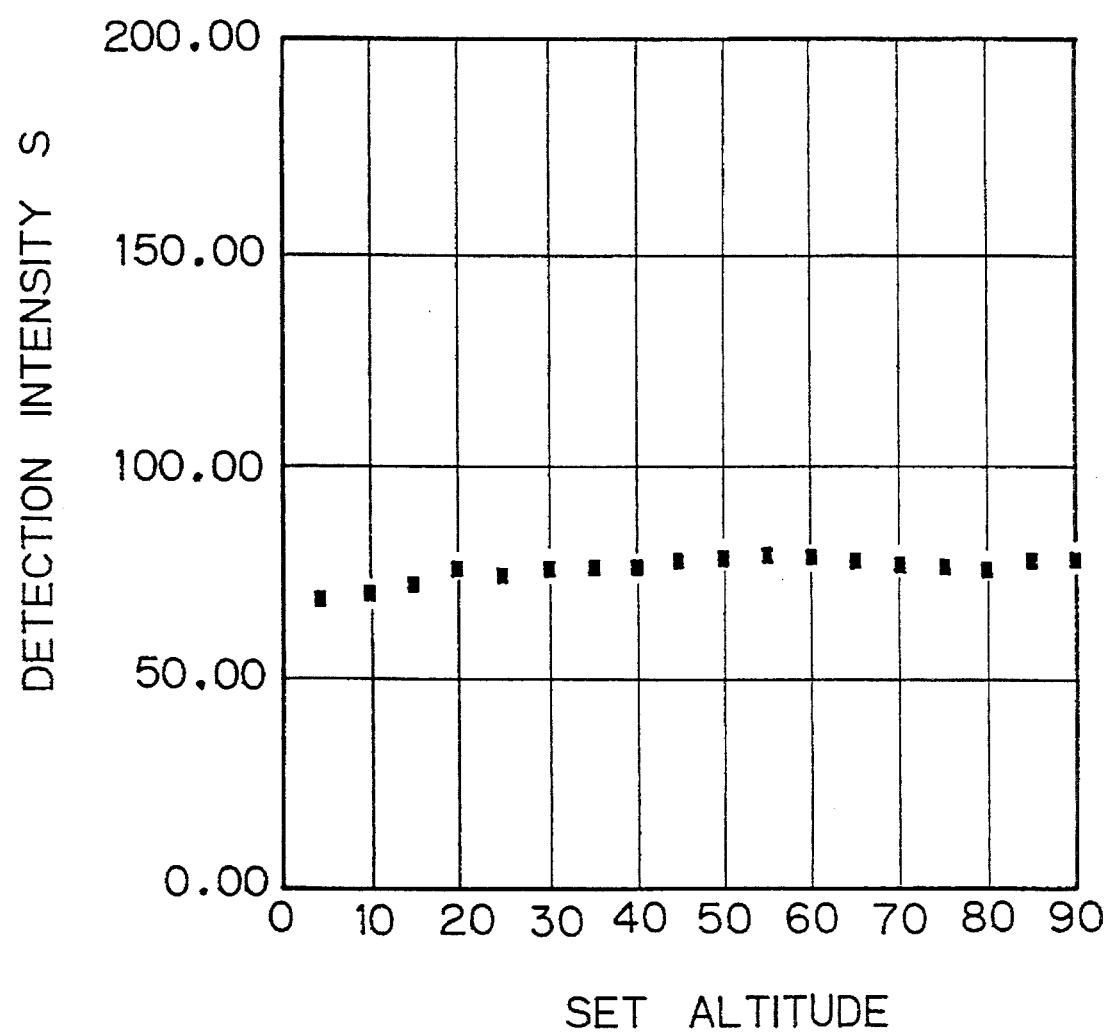
FIG. 10 is a diagram showing intensity detection characteristics of incident light received by the position detection element.

Incidentally, examples of output characteristics of the position detection element 37 calculated in accordance with the formula (4) are shown in FIGS. 8, 9 and 10.

(B) Deposition Principle of Light Reception Point of the Insolation Sensor

Figure 5:
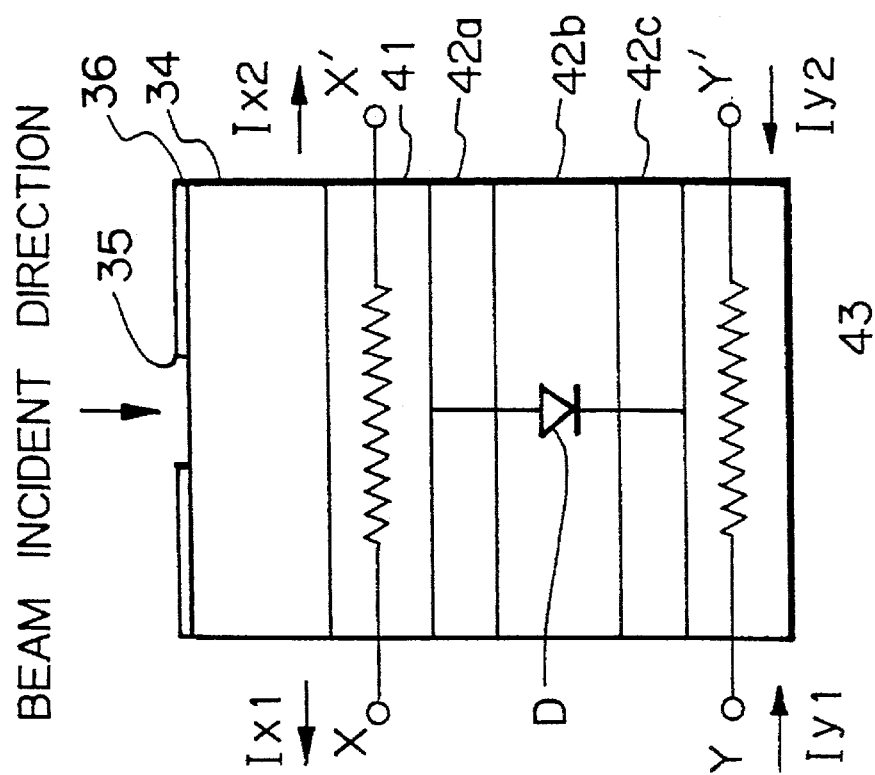
FIG. 5 is a schematic view for explaining the functions of the photoelectric conversion device main body.

Next, the position detection principle of the light reception pint P(x, y) of the spot beam H by the photoelectric conversion device main body 32 will be explained with reference also to FIG. 5.

As already described, the photoelectric conversion film 42 generates the photoelectromotive force at the irradiation portion of the spot beam H and the irradiation portion generates as a whole the photocurrent Io. This photocurrent Io flows in from the side of the Y-direction resistor film 43 and flows out to the X-direction resistor film 41 side through the photoelectric conversion film 42. Here, it will be assumed for purpose of simplification that expansion of the spot beam hardly exists. In practice, however, the beam passing through the pin-hole 35 and incident onto the position detection element 37 expands and its intensity is also different in some cases, as will be described later.

In the Y-direction resistor film 43, detection currents Iy1 and Iy2 flow in the Y-axis direction from the lead electrodes Y and Y', respectively, to the light reception point P through the sheet resistor, and in the X-direction resistor film 41, detection currents Ix1 and Ix2 outflows in the X-axis direction from the light reception point P to the lead electrodes X and X', respectively, through the sheet resistor. In this case, the current flowing into and current flowing out from the light reception point P are equal to each other and become the photocurrent Io. Accordingly, their relationship can be expressed as follows:

$$Ix1+Ix2=Iy1+Iy2=Io \quad (5)$$

The point immediately below the pin-hole 35 which is the center point of the position detection element 37 is used as the origin O(0, 0). Accordingly, when this origin O is the light reception point P, the relationship between the respective currents Ix1, Ix2, Iy1 and Iy2 can be expressed as follows:

$$Ix1=Ix2 \text{ and } Iy1=Iy2$$

Io denotes a total current values of respective currents Ix1 and Ix2 or Iy1 and Iy4 each flowing through a pair of the X-direction electrodes or a pair of the Y-direction electrodes, and represents an intensity of the solar irradiation.

Figure 14:
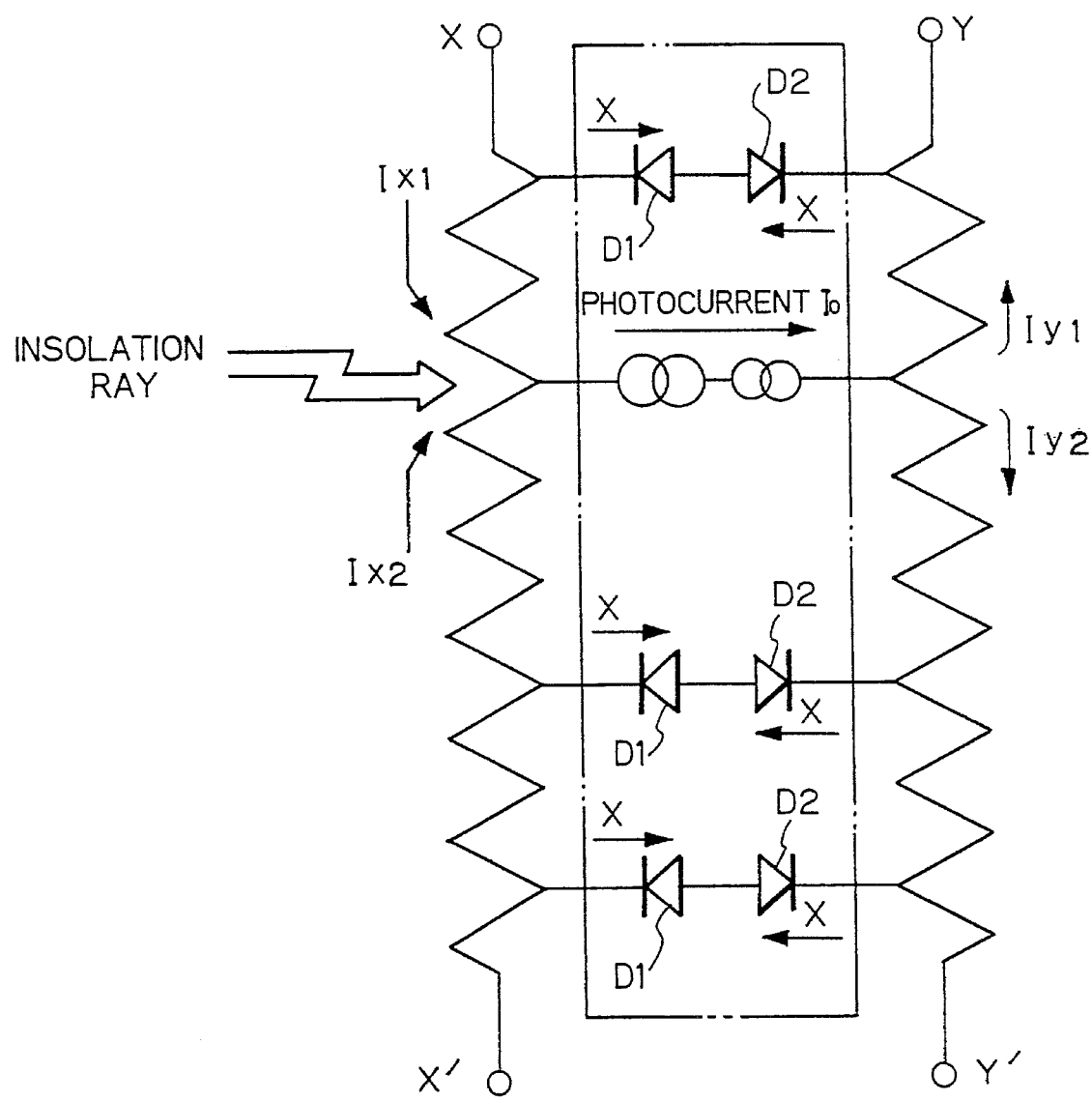
FIG. 14 is a schematic circuit diagram of the position sensor element.

The symbol in FIG. 14 represented by interlocked circles represents a cell component having an electromotive force. In other words, because the origin O is exactly at the center of the electrodes X and X' in the X-direction resistor film 41, the sheet resistance values at the respective lead electrodes X and X' become equal to each other, and the detection current values IX1 and IX2 are equal to each other. Similarly, because the origin O exists exactly at the center of the lead electrodes Y and Y' in the Y-direction resistor film 43, the sheet resistance values at the lead electrodes Y and Y' become equal to each other; hence, the detection current values Iy1 and Iy2 are equal to each other.

As the light reception point P of the spot beam H deviates from the origin O, the values of the detection currents Ix1 and Ix2 increase in proportion to the deviation distance in the X-axis direction while the values of the detection current Iy1 and Iy2 decrease in proportion to the deviation distance in the Y-axis direction. In other words, the detection current value changes in such a manner as to correspond to each coordinate value of the light reception point P(x, y). Accordingly, when the coordinate values of the light reception point P(x, y) are defined as the proportions of the values of the X-direction change component $\Delta Ix$ (=Ix1–IX2) and the Y-direction change component $\Delta Iy$ (=Iy1–Iy2) to the total photocurrent Io (refer to the aforementioned formula (5)), as expressed below:

$$x=\Delta Ix/Io \quad (6)$$

$$y=\Delta Iy/Io \quad (7)$$

the position of the light reception point P can be detected.

In this way, the light reception point P of the spot beam H can be detected in accordance with the equations (6) and (7). In practice, however, the spot beam H has a certain diameter. Therefore, the coordinates (x, y) of the light reception point P to be detected is determined as the position of the center of the intensity distribution of the received beam. In other words, though the photocurrent Io generated in the position detection element 37 from the spot beam H is generated from the whole region of the light reception portion, the detected current values Ix1, Ix2, Iy1 and Iy2 are detected as being output from an extremely narrow region represented as the light reception point P for the current generated from the whole region.

Figure 6:
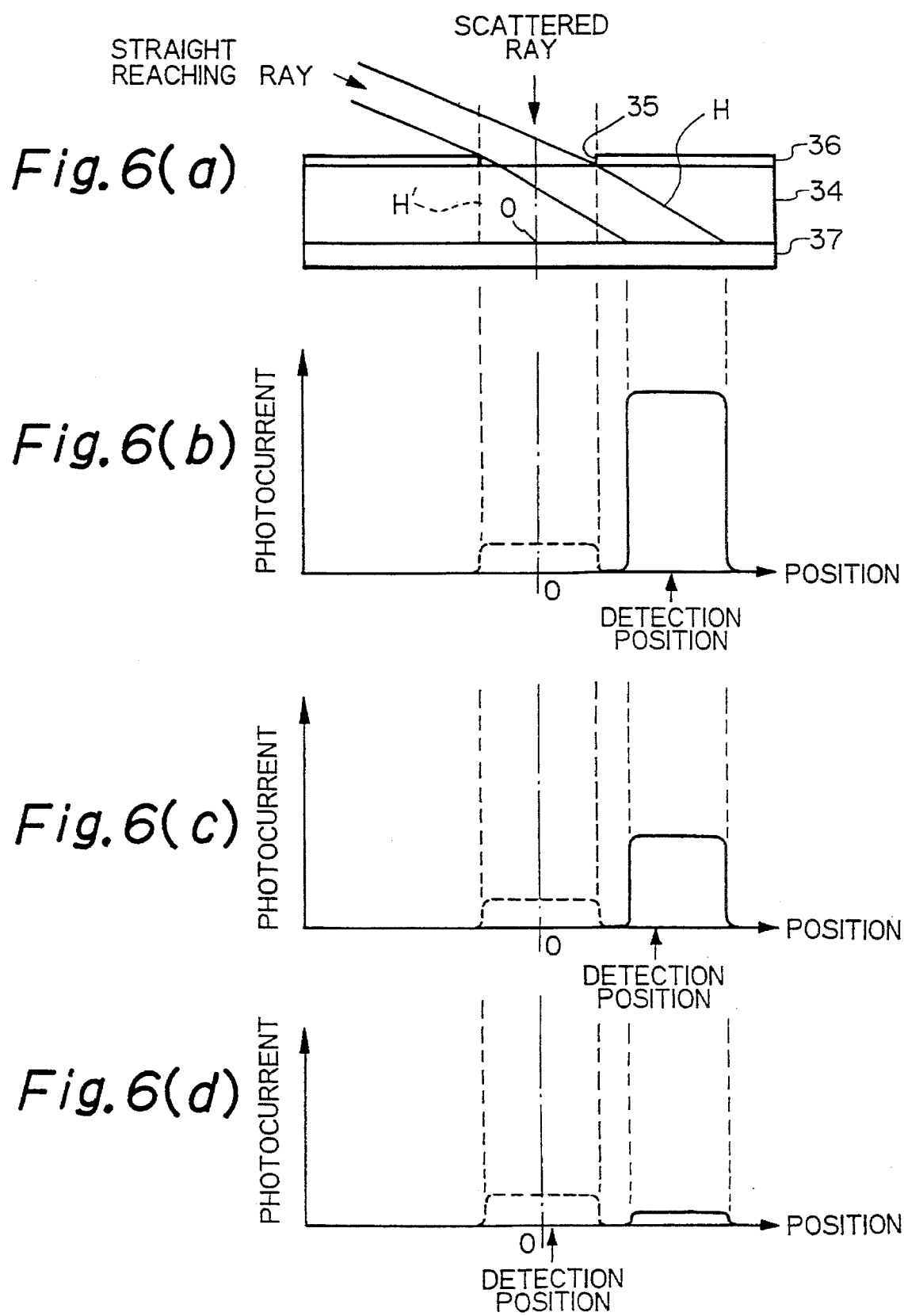
FIGS. 6(a)–6(d) are diagrams view for explaining the operation corresponding to weather conditions at a light reception point detected by a position sensor element.
Figure 11:
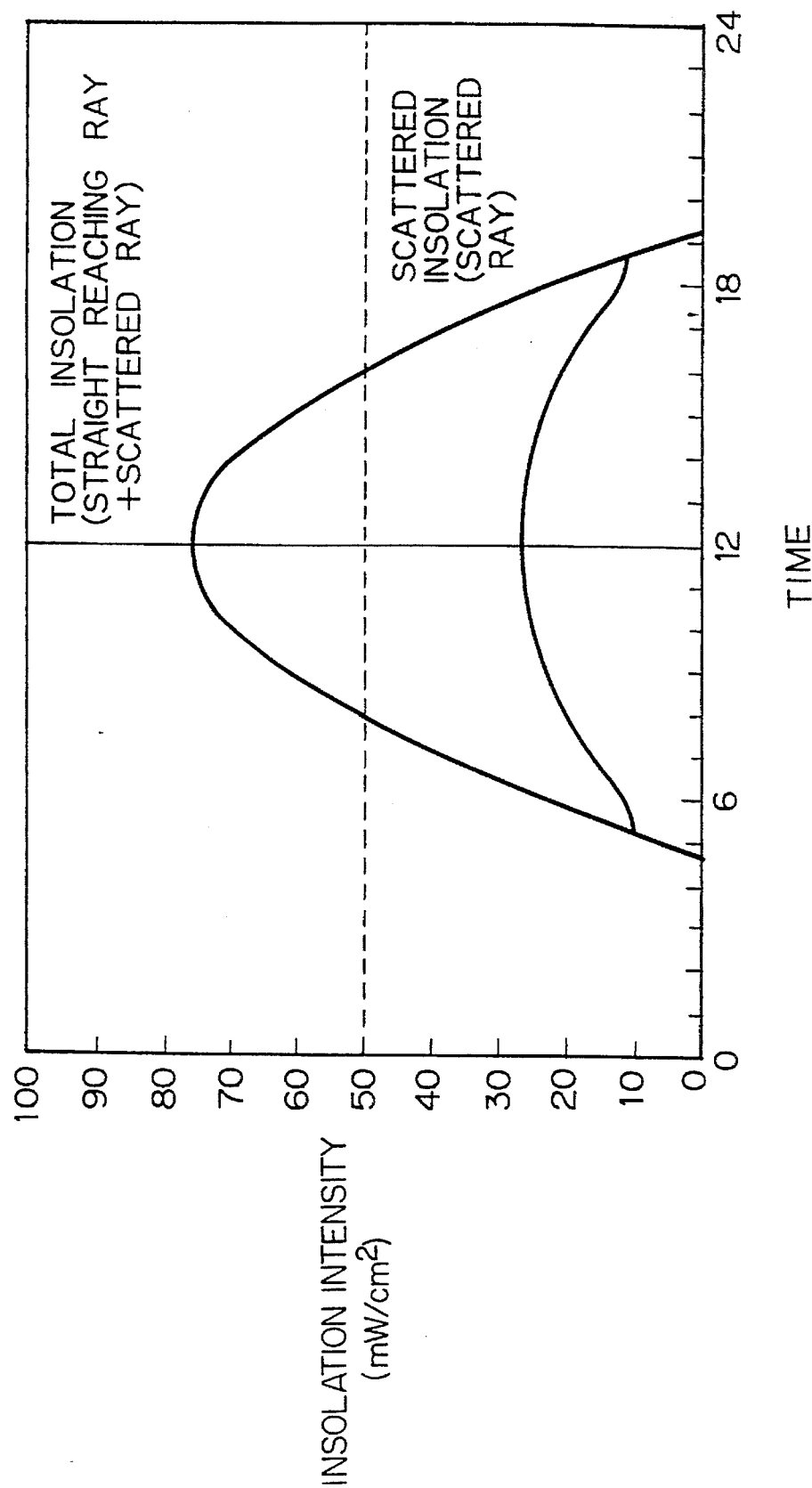
FIG. 11 is a diagram showing the change of full light insolation and scattered light insolation and the change of an insolation intensity with the passage of time.

(C) Detection Operation of the Insolation Direction Corresponding to Changes in the Weather The influence of the weather conditions on the detection of the insolation direction and the altitude by such an insolation sensor 31 will now be explained with reference to FIGS. 6 and 11. As already described, the insolation reaching the ground from the sun includes straight reaching rays from the direction of the sun and weak scattered rays scattered by clouds, etc., and falling substantially from directly above. For example, as shown in FIG. 11 (data in Nagoya city in July of a certain year), the insolation intensity of the total insolation rays (direct rays plus scattered rays) and that of the scattered rays change with time. Because the component of the direct rays changes greatly with the quantities of clouds in the sky, the arriving proportions of the direct rays and the scattered rays changes in accordance with the weather conditions.

Accordingly, the explanation will be hereby given by dividing the weather conditions into the following three conditions with reference to FIGS. 6(a)–6(d). FIG. 6(a) is a sectional view of the photoelectric conversion device main body 32, and represents the state where the straight reaching rays from the sun at the altitude θ are incident as the spot beam H into the pin-hole 35. It will be hereby assumed that the scattered rays are always incident as the spot beam H' onto the region having the origin O of the position detection element 37 as the center from substantially directly above (altitude 90°).

When the weather is fine, there are no clouds cutting off the solar rays. Accordingly, the insolation intensity of the direct rays reaching the ground from the sun is by far greater than the insolation intensity of the scattered rays. Therefore, as shown in FIG. 6(6), the insolation intensity S of the direct rays at the light reception point P is much greater than the insolation intensity S' of the scattered rays near the origin O. Accordingly, the total photocurrent Io is almost fully comprised by the photocurrent component of the light reception point P receiving the spot beam H of the direct rays, and in consequence, the position of the center of the distribution of the received light intensity substantially coincides with the light reception point P of the direct rays. In this case, the direction affected by the insolation substantially coincides with the direction of reception of the direct rays, that is, the direction determined by the light reception point P.

Next, when the weather is slightly cloudy with some clouds in the sky, the solar rays are somewhat cut off by the clouds. Accordingly, the insolation intensity of the direct rays reaching the ground from the sun is weaker than that in fine weather, and the distribution state of the insolation intensity, too, enters the state where the component of the insolation intensity by the scattered rays cannot be neglected, as shown in FIG. 6(c).

In this case, the light reception position (x, y) detected by the position detection element 37 is the position of the center of the insolation intensity distribution obtained by synthesizing the photocurrent generated by the spot beam H of the direct rays and the photocurrent generated by the spot beam H' of the scattered rays. For this reason, the light reception position (x, y) is detected as a position which is somewhat different from the light reception point P by the direct rays. However, because the light reception position detected in this manner substantially corresponds to the direction of the insolation received on the ground from the sun, it can be utilized as the substantial insolation direction when correction of air conditioning is effected.

When the weather is cloudy with large quantities of clouds in the sky, the solar rays are almost fully cut off by the clouds. Therefore, the insolation reaching the ground consists almost fully of the scattered rays and the component of the direct rays is small. Accordingly, as shown in FIG. 6(d), the spot beam H' having the origin O as the center occupies the major proportion of the light components incident onto the position detection element 37, and the light reception position detected by the position detection element 37 also exists substantially near the origin O. Because the light reception position detected in this manner substantially corresponds to the direction of the insolation received on the ground from the sun in the same way as described above, it can be utilized as the practical insolation direction.

The air-conditioning condition of the air conditioner inside the car, not shown, can be accurately corrected in accordance with the insolation receiving direction of the basis of the insolation receiving direction, the altitude and the insolation intensity that are detected in this way, in such a manner as to reduce the influence of the insolation which the inside of the car substantially receives from the sun. In other words, the air-conditioning state inside the car can be kept comfortable.

According to the embodiment given above, the insolation rays from the sun are concentrated into a spot shape and are allowed to be incident onto the photoelectric conversion film 42 of the position detection element 37 through the pin-hole 35, and the photocurrent Io generated in the light reception region is detected as the light reception point P corresponding to the center position of the current intensity. Accordingly, the insolation sensor can be constituted as a simple and compact construction, and can detect the insolation direction as the position of the center of the intensity distribution of the solar insolation.

In this way, the substantial insolation direction, altitude and intensity received as the combination of the straight reaching rays and scattered rays of the solar rays on the ground can be detected. Even when the intensity of the straight reaching rays changes in accordance with the weather conditions, the substantial insolation direction comprising the straight reaching rays and the scattered rays can be detected and can be utilized as the practical insolation direction in correcting the insolation in the air conditioner.

The package 33 made of the light-intercepting resin has a shape formed by molding the side surface portion of the glass substrate 34 of the photoelectric conversion device main body 32 and the position detection element 37, and the package 33 has the window portion 40 which is concentric with the pin-hole 35 and which is disposed around the pin-hole 35. In other words, the periphery of the pin-hole 35 is widely opened. Accordingly, even the rays at low altitude are allowed to be incident into the pin-hole 35, and sensitivity to the low altitude rays can be secured sufficiently. Particularly in this case, the peripheral portion of the window portion 40 of the package 33 is shaped into a conical shape gently inclining downwards towards the window portion 40. Accordingly, the sensitivity to the rays of the low altitude can be secured more reliably.

Figure 12:
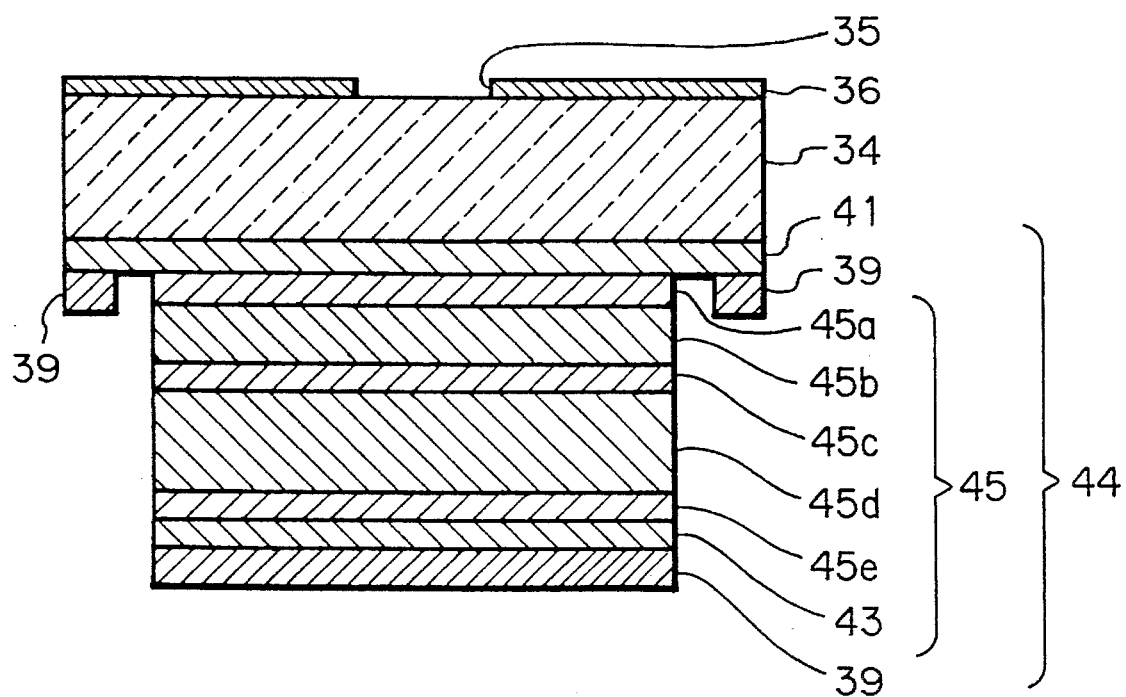
FIG. 12 is a schematic sectional view showing a second embodiment of the present invention and corresponding to FIG. 4.
Figure 13:
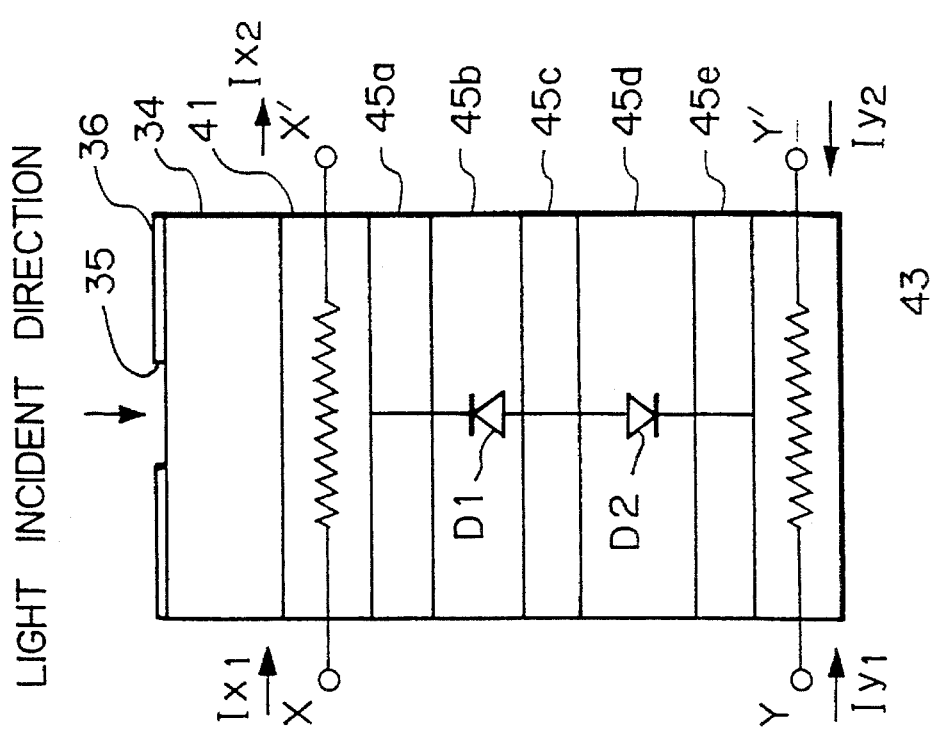
FIG. 13 is a side sectional view of the second embodiment of the photoelectric conversion device main body.

FIGS. 12 to 14 show the second embodiment of the present invention. Hereinafter, the portions of this embodiment different from the first embodiment will be described. The position detection element 44 in this embodiment includes a photoelectric conversion film 45 having a structure wherein a-Si alloy films are laminated on the X-direction resistor film 41 into an n-i-p-i-n structure so as to connect in series two photo-diode components in opposite polarity. In the steady state where no rays are incident onto this photoelectric conversion film 45, or in other words, when voltages having different polarities are applied between the photo-diode components connected in series as described above, no current is permitted to flow.

More specifically, as schematically shown in FIG. 12, this photoelectric conversion film 45 has a five-layered structure wherein an n-type semiconductor layer 44a made of a-Si, an i-type semiconductor layer 45b made of intrinsic a-Si (i1-SiC), a p-type semiconductor layer 45c made of a-SiC, an i-type semiconductor layer 45a made of intrinsic a-Si (i2-Si) and an n-type semiconductor layer 45e made of a-Si are sequentially laminated in order named from the side of the incident direction of the beam (from the side of the X-direction resistor film 41). As also shown in FIG. 13, this structure is equivalent to a circuit construction wherein two photo-diodes D1 and D2 are connected in opposite directions with their anodes being connected in common. Incidentally, the photoelectric conversion film 45 can also be formed by laminating the a-Si alloy films into the p-i-n-i-p layer structure. In such a case, however, the resulting two photo-diodes become equivalent to the state where they are connected in common by their cathodes.

In this photoelectric conversion film 45, the thickness of the i-type semiconductor layer 45b corresponding to the photo-diode D1 is set to be greater than that of the i-type semiconductor layer 45d corresponding to the photo-diode D2, for example. Accordingly, when the spot beam H is incident onto the photoelectric conversion film 45 through the X-direction resistor film 41, the photocurrent ID1 through this photo-diode D1 corresponding to the i-type semiconductor layer 45b is greater than the photocurrent ID2 through the photo-diode D2 corresponding to the i-type semiconductor layer 45d, and the photo-current Io flows as a whole from the side of the X-direction resistor film 41 towards the side of the Y-direction resistor film 43 through the photoelectric conversion film 45.

This photocurrent Io can be handled in the same way as the photocurrent Io explained in the first embodiment, and can be obtained as a current having a different value between the photocurrent ID1 of the photo-diode D1 and the photocurrent ID2 of the photo-diode D2 (that is, ID1-ID2).

In addition to the same action and effect as that of the first embodiment, this construction can provide the following effect. As described above, the photoelectric conversion film 45 has the structure wherein the tow photodiodes D1 and D2 are connected in series in opposite directions. Therefore, as also shown in FIG. 14, a leakage current does not occur with the change of the temperature at the position where the spot beam H is not incident, but the photocurrent flows only at the position to which the spot beam H is incident. Accordingly, this embodiment provides the advantage that the light reception point P of the spot beam H can be correctly detected even in a high temperature range.

Incidentally, the second embodiment given above employs the construction wherein the beam received by the photoelectric conversion film 45 is converted into the photocurrent and the light reception point P is detected in the position detection element 44. However, besides this construction, the construction described below can also be employed.

To detect the x coordinates in the X-axis direction, for example, a predetermined voltage (5 v, for example) is applied between the lead electrodes Y and Y' of the y-direction resistor film 43 so as to provide the Y-direction resistor film 43 with a potential gradient $\Delta V$. In this state, the potential Vx at the position of the photoelectric conversion film 45 which becomes conductive because the spot beam H is incident thereon, is detected by the X-direction resistor film 41. The voltage value as the difference between this detection voltage Vx and the potential Vxo at the position of the origin O is divided by the potential gradient $\Delta V$ to obtain a ratio. In this way, a value corresponding to the coordinates X can be obtained.

Similarly, the coordinates y in the Y-axis direction can be determined by replacing the roles of the X-direction resistor film 41 and the Y-direction resistor film 43 described above. The insolation intensity is determined in the following way. A predetermined voltage V is applied to both lead electrodes Y and Y' of the Y-direction resistor film 43 so as to make the potential distribution on the Y-direction resistor film 43 uniform. Next, an output current flowing from the side of the Y direction resistor film 43 to the side of the X-direction resistor film 41 is detected at the incident position of the spot beam H. Because all portions on the Y-direction resistor film 43 are at the same potential, this output current is at substantially the same potential irrespective of the incident position of the spot beam H, and becomes a signal which changes in accordance with the insolation intensity.

Figure 15A:
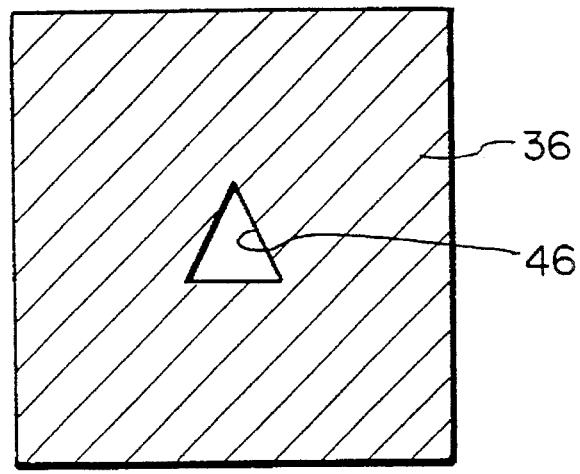
FIGS. 15(a)–15(c) are schematic views each showing the shape of light transmission means according to the third, forth and fifth embodiments of the present invention.
Figure 15B:
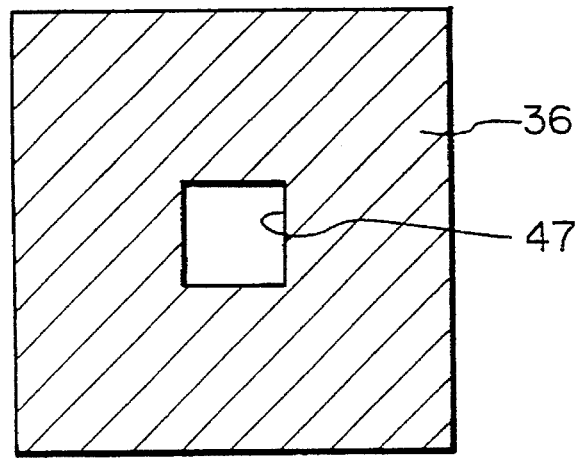
Figure 15C:
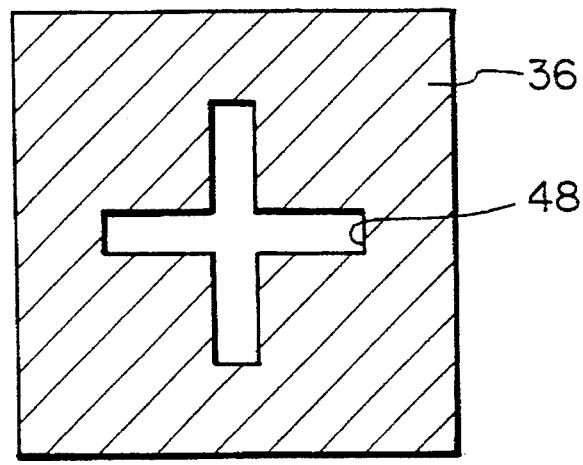

FIGS. 15(a), (b) and (c) show the third, forth and fifth embodiments of the present invention, respectively. These embodiments are provided with a regular triangular light transmission portion 46, a square light transmission portion 47 and a criss-cross light transmission portion 48 in place of the pin-hole 35 as the light transmission means. In these third to fifth embodiments, the position detection element 37 or 44 detects the position of the centroid of the insolation intensity at the portions receiving the insolation. Therefore, they can provide the same action and effect as those of the first and second embodiments while the detection position is not affected by the shape of the light transmission means.

Figure 16:
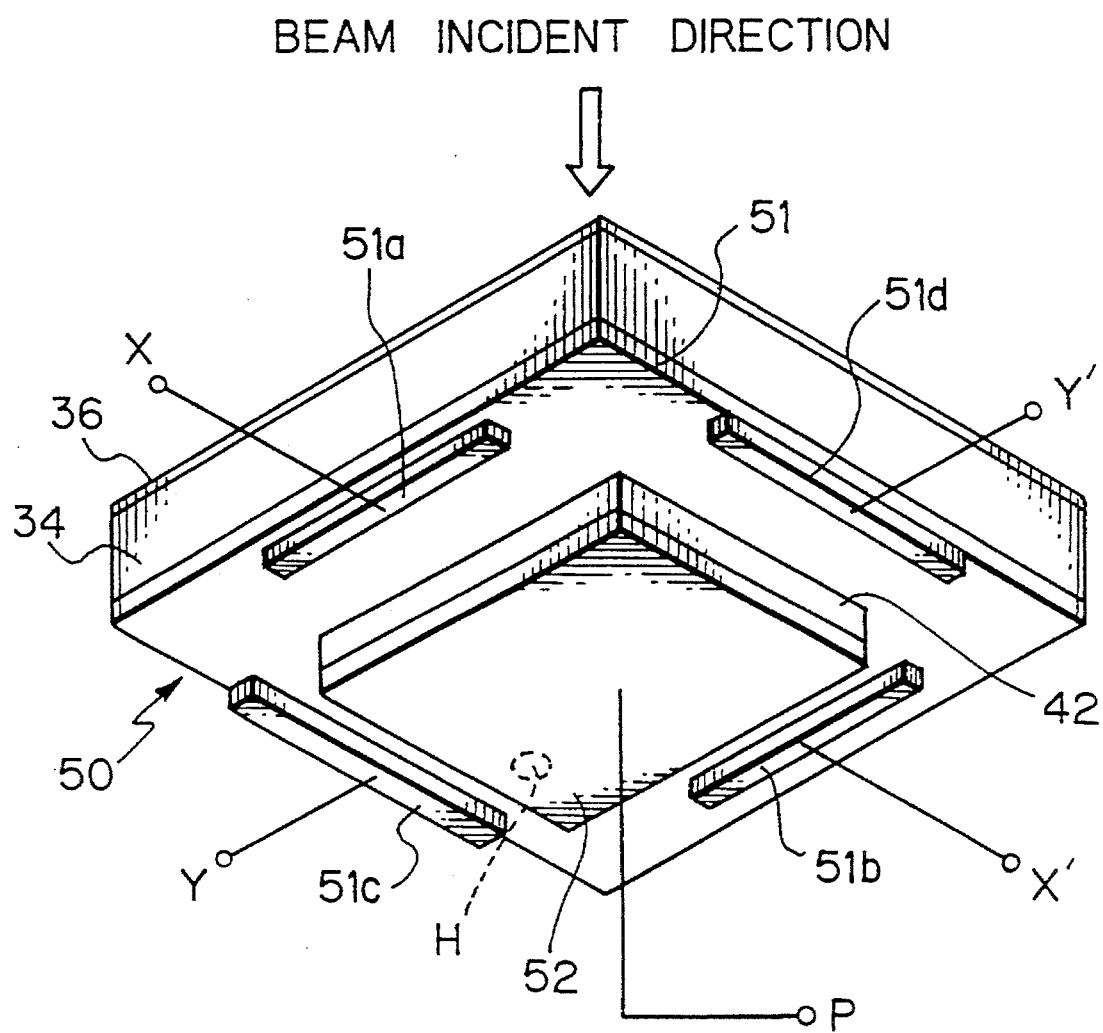
FIG. 16 is a bottom perspective view showing the sixth embodiment of the present invention and corresponding to FIG. 3.
Figure 17:
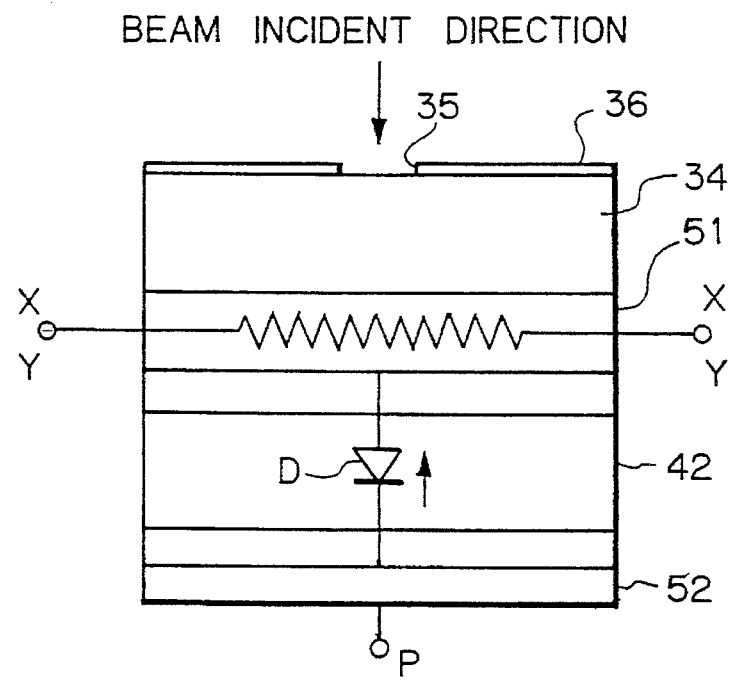
FIG. 17 is a schematic view corresponding to FIG. 5.
Figure 18:
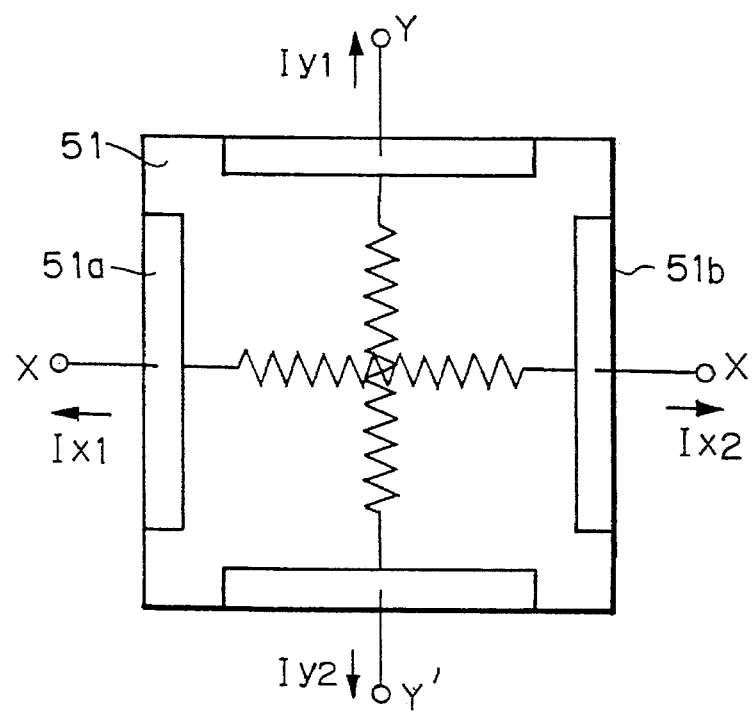
FIG. 18 is a schematic view for explaining the detection principle.

FIGS. 16 to 18 show a sixth embodiment of the present invention. Hereinafter, only the portions of this embodiment that different from the first embodiment will be explained. The position detection element 50 of the photoelectric conversion device 49 has a structure wherein a transparent resistor film 51 formed on the entire back surface of the glass substrate 34, the photoelectric conversion film 42 which is the same as that of the first embodiment and a metal electrode 52 covering the entire surface of this photoelectric conversion film 42 are sequentially laminated, belt-like electrodes 51a, 51b, 51c, 51d having a lower resistance value than that of the transparent resistor film 51 are formed on the sides of the transparent resistor film 51, a total of four lead electrodes X, X', Y and Y' are extended from the electrodes 51a to 51d, respectively, and a lead electrode P is extended from the metal electrode 52.

According to such a construction, the photo-diode D by the photoelectric conversion film 42 is interposed between the transparent resistor film 51 and the metal electrode 52 as schematically shown in FIG. 17. The photoelectric conversion film 42 generates an electromotive force due to the photoelectric conversion function and causes the photocurrent to flow only at the position to which the spot beam H is incident. Since this photocurrent flows in the reverse direction to the p-n junction, it flows in the longitudinal direction at the position to which the spot beam H is irradiated.

The lead terminals X, X' and Y, Y' are disposed at positions opposing one another, and are therefore connected through the resistance components of the transparent resistor 51. It will be hereby assumed that the spot beam H is incident onto the light reception point P(x,y) of the position detection element 50 in the state where a predetermined bias voltage is applied to the lead electrode P. Then, the photocurrent develops at this light reception point P, and the photocurrents Ix1, IX2, Iy1, Iy2 corresponding to the lead terminals X, X', Y and Y', respectively, are detected from these lead terminals. The coordinates of the light reception point P(x,y) can be determined by calculating the photocurrents Ix1, Ix2, and Iy1, Iy2 detected in this way in accordance with the following equations:

$$x=2/L\times(Ix1-Ix2)/(Ix1+Ix2) \quad (8)$$

$$y=2/L\times(Iy1-Iy2)/(Iy1+Iy2) \quad (9)$$

On the other hand, the total current value obtained by summing up the four photo currents Ix1, Ix2, Iy1 and Iy2 represents an intensity of the solar irradiation.

Accordingly, this sixth embodiment can also provide the same action and effect as that of the first embodiment. Incidentally, it is possible to use the photoelectric conversion film 45 formed by connecting the diodes in series in opposite directions, as used in the second embodiment, in place of the photoelectric conversion film 42 described above. The photoelectric conversion film 42 may be a film having opposite polarities for the p-n junction.

Besides the current detection type device described above, the same effect can likewise be obtained by a voltage detection type device which applies a predetermined voltage between the lead electrodes X and X' (or Y and Y'), detects the voltage at the irradiation position of the spot beam H by the metal electrode 52, and detects the coordinates as the voltage corresponding to the x coordinates (or the y coordinates) of the light reception point P.

Though each of the embodiments given above employs the construction wherein the package 33 covers the peripheral portion of the upper surface of the light shading film 36, this construction is not limitative. In other words, it is possible to dispose a package having a structure for covering at least the side surface portion of the glass substrate 34 and the position detection element 37 with the bonded portions of the electrodes 39.

Figure 19:
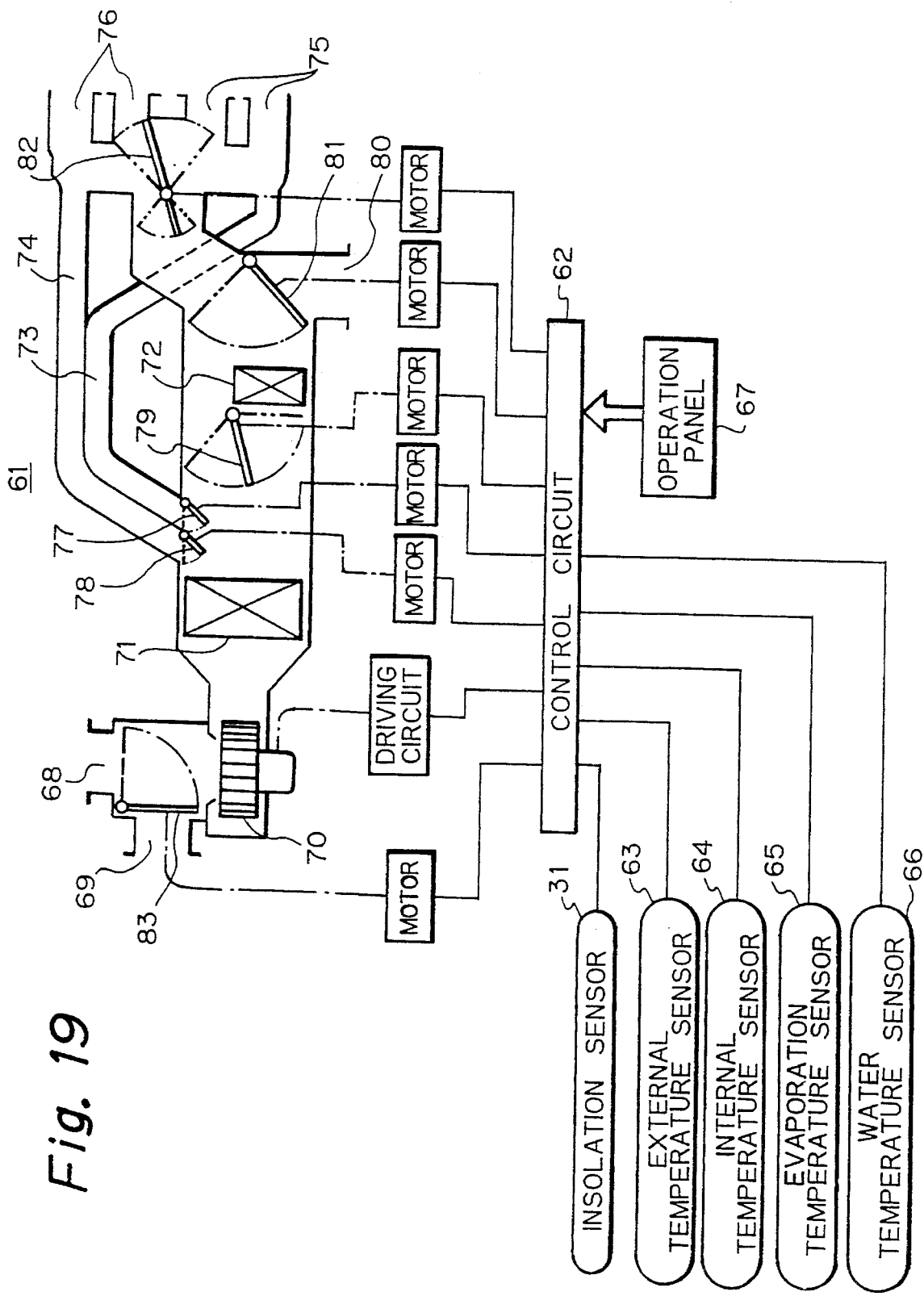
FIG. 19 is an overall structural view schematically showing an air conditioner according to a seventh embodiment of the present invention.
Figure 20:
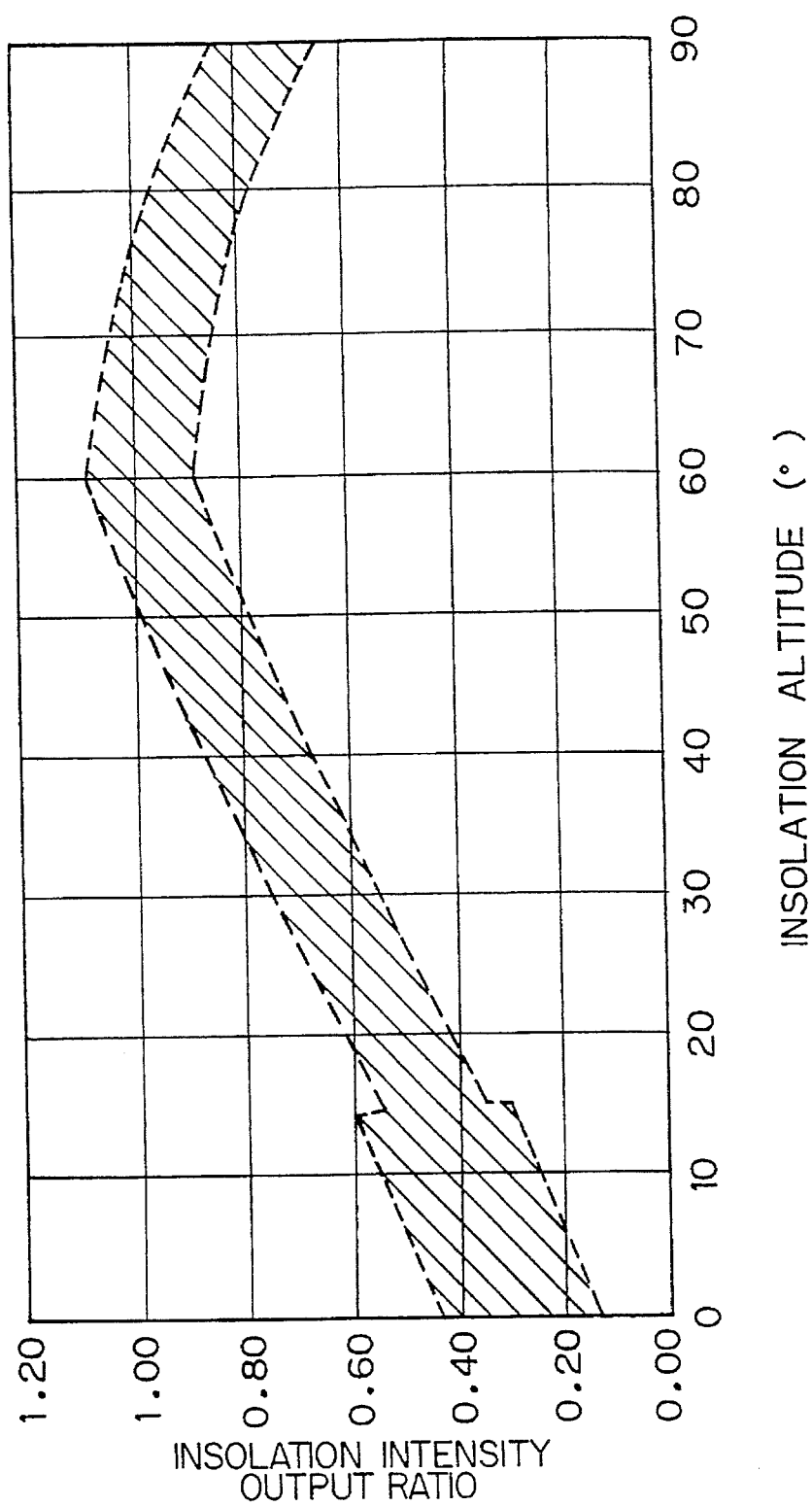
FIG. 20 is a diagram showing an ideal ratio of an insolation altitude and an output.
Figure 21A:
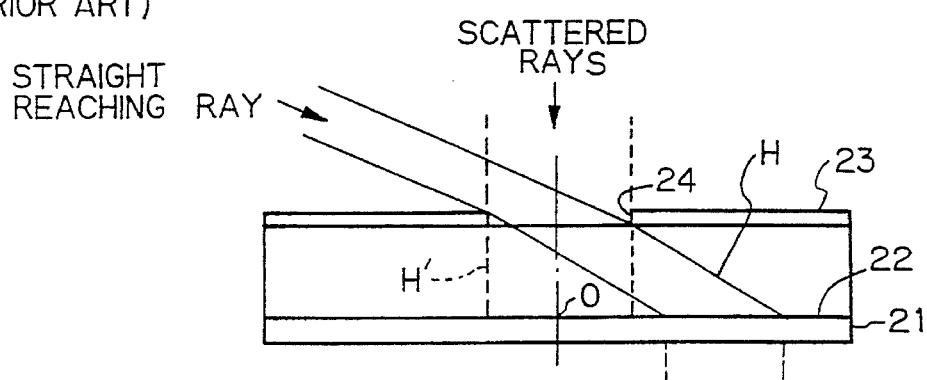
FIGS. 21(a)–21(d) are diagrams showing a prior art device.
Figure 21B:
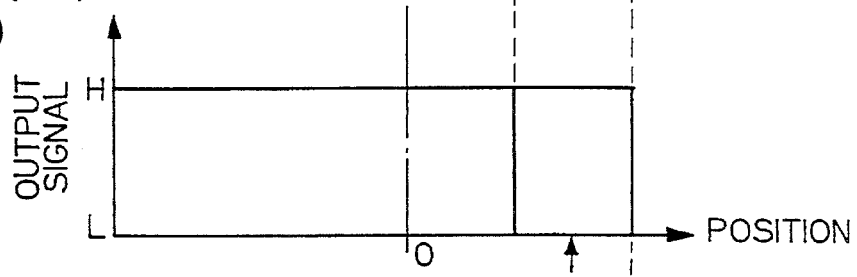
Figure 21C:
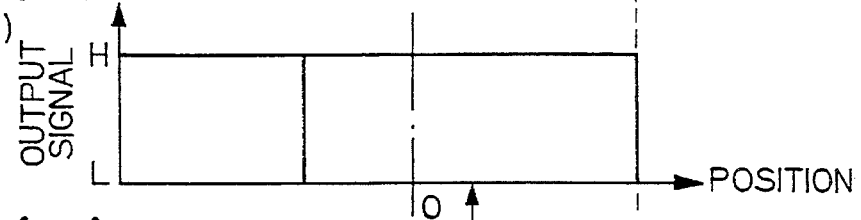
Figure 21D:
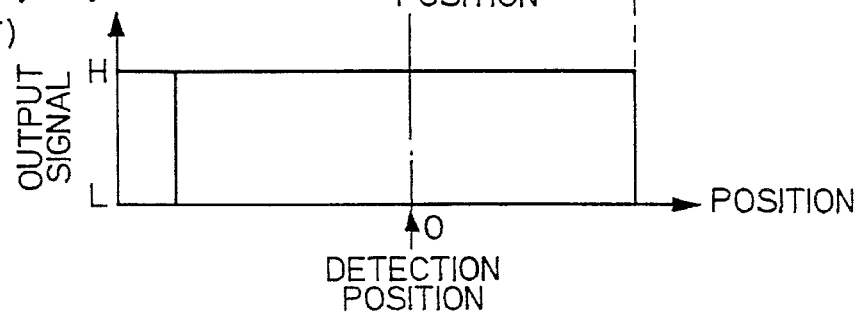

FIGS. 19 and 20 show a seventh embodiment of the present invention, wherein the insolation sensor 31 explained in each of the embodiments is used for controlling the air conditioner of a car. In this seventh embodiment, correction for the insolation on the air conditioner is effected in such a manner as to correspond to the insolation which the passenger(s) inside the car receives from the sky, by utilizing the function of the insolation sensor 31, in that it can detect the substantial insolation direction received on the ground as the combination of the direct and scattered solar rays, the altitude and the insolation intensity.

FIG. 19 shows the overall construction of the air conditioner 61. The insolation sensor 31 is disposed on the upper surface of a dash board (not shown) on the front seat side inside the car. The insolation sensor 31 can detect the substantial insolation direction of the solar rays, the altitude and the intensity as described already, and output its detection signals to the control circuit 62. Besides this insolation sensor 31, there are disposed an external temperature sensor 63, an internal temperature sensor 64, a temperature sensor 65 for detecting a temperature of a rear part of a cooler (not shown), a water temperature sensor 66 for detecting the temperature of engine cooling water and an operation panel equipped with various operation switches (not shown), as various sensors for controlling the air-conditioner 61. The control circuit 62 executes computation processing on the basis of the signals input from these sensors and members, and controls the operation of the air-conditioner 61.

The construction of the air-conditioner 61 will now be explained briefly. Air sucked from an internal air intake port 68 or from an external air intake port 69 into a blower 70 is cooled by an evaporator 71. Cooled air is sent to a heater core 72 side and is sent also to right and left blow-out ports 75, 76 through cooled air bypass ducts 73, 74. Dampers 77, 78 for varying the cooled air bypass quantity are disposed on the inlet side of the cooled air bypass ducts 73, 74, respectively.

An air mix damper 79 is disposed upstream of the heater core 72, and regulates a distribution ratio of air passing thorough the heater core 72 and air bypassing the heater core 72 through the opening control thereof. Blow-out ports 80 at the feet are disposed with right and left vent blow-out ports 75, 76 on the downstream side of the heater core 72, and are opened and closed by a damper 81. The air flow ratio of the right and left vent blow-out ports 75, 76 is adjusted by a damper 82. Incidentally, the internal air intake port 68 and the external air intake port 69 are selectively opened and closed by an internal/external air change-over damper 83.

To make insolation correction control on the basis of the output signal of the insolation sensor 31, the control circuit 62 regulates the openings of the dampers 77, 78 of the cooled air bypass ducts 73, 74, adjusts the temperature difference between the blow-out temperature of the vent blow-out ports 75, 76 and the blow-out temperature of the blow-out port 80 at the feet, and thus automatically corrects the influence of the insolation rays. When the insolation direction inclines either to the right or left, the control circuit 62 controls the opening of the dampers 77, 78 of the cooled air bypass ducts 73, 74 between the right and left sides so as to make the blow-out temperature and the air flow quantity different between the right and left sides, or adjusts the air flow ratio of the right and left vent blow-out ports 75, 76. In this way, it corrects the air conditioning balance inside the car in accordance with the inclination of the insolation.

Because air conditioning control is corrected on the basis of the detection results of both insolation direction and the altitude as described above, air conditioning control can be carried out with better balance in such a manner as to correspond to the insolation altitude in the following case.

Namely, when the insolation direction exists near just beside the car with the altitude at that time being as low as about 10° to about 15°, for example, the insolation rays fall not only into the window on the incident side but also into the opposite window side. In such a case, not only is the quantity of air conditioning air from the blow-out port on the insolation incident side corrected, but the quantity of air conditioning air from the blow-out port on the opposite side is also corrected in accordance with the insolation, so that air conditioning inside the car can be carried out with good balance between the right and left sides.

As already described with reference to the explanation of the first embodiment, the insolation sensor 31 outputs the current corresponding to the insolation intensity shown in FIG. 10 in accordance with the altitude of the insolation. Inside the car, in practice, however, the insolation is substantially cut off by the roof of the car when the altitude θ of the insolation exceeds 60°. Consequently, the quantity of the incident rays into the car drops.

In other words, when the insolation intensity received by the seat portions inside the actual car in accordance with the insolation altitude is measured, the intensity increases in accordance with the sine curve as already described within the range of the altitude of θ=0° to near 60° as represented by the hatched portion in FIG. 20, and the incident quantity drops within the range of θ=60° to 90° because the insolation rays are cut off by the roof of the car. Accordingly, the incidence characteristics either drop to some extent or go into saturation. In the diagram of FIG. 20, the reason why the output ratio of the insolation intensity exists within the range of 0.2 to about 0.4 even at the insolation altitude of θ=0° is because there are the incidence components due to the scattered rays from the directly above. The output ratio is expressed by a ratio in such a manner that the center value of the insolation intensity near the insolation altitude θ=60° becomes 1.0.

In this way, the correction values of the insolation intensity in accordance with the insolation altitude are converted in advance to a map and stored in a memory inside the control circuit 62 in accordance with the characteristics of the practical incident insolation, and the corrected value of the insolation intensity is read out in accordance with the insolation altitude detected by the insolation sensor 31. Therefore, correction of air conditioning can be effected and the influence of the insolation practically received inside the car can be corrected accurately.

The embodiments of the present invention detect the substantial incidence direction of insolation, altitude and intensity by the insolation sensor 31, and correct air conditioning in accordance with the insolation incidence condition inside the car, by using the control circuit 62 on the basis of the detection outputs. Therefore, in comparison with the case where air conditioning is corrected in such a way as to correspond to only the insolation direction, air conditioning control inside the car can be suitably corrected to improve the balance so air conditioning control can be carried out more finely in such a manner as to correspond to the altitude of the insolation rays incident substantially into the car.

Further, because the detection output by the insolation sensor 31 is corrected on the basis of the data prepared in advance as a map so as to correspond to the insolation altitude, air conditioning correction control can be made to cope with the actual conditions from the resulting data of the insolation altitude irrespective of the position of disposition of the insolation sensor 31.

According to the insolation sensor of the present invention, only the rays from the sun which are incident onto the predetermined spot region are transmitted by the light shading means, and the beam incident into the light reception surface through the light shading means is photoelectrically converted by the position detection element into the electrical signals corresponding to the two-dimensional light reception position and to the light reception intensity so as to detect the insolation intensity incident onto the light reception surface of the position detection element and the center of its two-dimensional intensity distribution. Accordingly, the overall center position corresponding to the insolation intensity distribution of the direct rays and scattered rays of the insolation can be detected, and the substantial direction of the insolation received on the ground and its intensity can be detected.

We claim:

1. An insolation detection system comprising:
   an insolation sensor including:
   a) light shading means having a transmission aperture defined therein for transmitting a solar beam as a spot, and
   b) a position detection element disposed in a spaced-apart relationship with respect to said light shading means, said position detection element outputting an electrical signal corresponding to a position of said solar beam irradiated through said transmission aperture and corresponding to an intensity of said solar beam, said position detection element having
      i) a transparent X-direction resistor film,
      ii) a photoelectric conversion film disposed on said X-direction resistor film, for generating a photocurrent by means of a photoelectromotive force occurring at a portion of said photoelectric conversion film irradiated by said solar beam,
      iii) a Y-direction resistor film disposed on said photoelectric conversion film,
      iv) a pair of X-direction electrodes disposed at end portions of said X-direction resistor film opposing each other and having a resistance value lower than that of said X-direction resistor film, and
      v) a pair of Y-direction electrodes disposed at end portions of said Y-direction resistor film in a direction orthogonally crossing said X-direction electrodes, and having a resistance value lower than that of said Y-direction resistor film;
   irradiation direction determining means, operatively connected to said pairs of X-direction and Y-direction electrodes, for determining the irradiation direction of said solar beam based on a ratio of current values output from said pair of said X-direction electrodes and a ratio of current values output form said pair of said Y-direction electrodes; and
   irradiation intensity determining means, operatively connected to said pair of X-direction and Y-direction electrodes, for determining an intensity of said solar beam irradiation by summing up currents flowing through one of said pair of X-direction electrodes and said pair of Y-direction electrodes.

2. An insolation detection system comprising:
   an insolation sensor including:
   a) light shading means having a transmission aperture defined therein for transmitting a solar beam as a spot, and
   b) a position detection element disposed in a spaced-apart relationship with respect to said light shading means, for outputting an electrical signal corresponding to a position of said solar beam irradiated through said transmission aperture and corresponding to an intensity of said solar beam, said position detection element having
      i) a transparent resistor film,
      ii) a photoelectric conversion film disposed on said transparent resistor film, for generating a photocurrent by means of photoelectromotive force occurring at a portion of said photoelectric conversion film irradiated by said solar beam,
      iii) a common electrode disposed on said photoelectric conversion film,
      iv) a pair of X-direction electrodes disposed at end portions of said resistor film opposing each other, and having a resistance value lower than that of said resistor film, and
      v) a pair of Y-direction electrodes disposed at end portions of said resistor film different from said end portions in a direction orthogonally crossing a pair of said X-direction electrodes, and having a resistance value lower than of said resistor film;
   irradiation direction determining means, operatively connected to said pairs of X-direction and Y-direction electrodes, for determining the irradiation direction of said solar beam based on a ratio of current values output from said pair of said X-direction electrodes and a ratio of current values output from said pair of said Y-direction electrodes; and
   irradiation intensity determining means, connected to said pair of X-direction and Y-direction electrodes, for determining an intensity of said solar beam irradiation by summing up currents, each flowing through one of the four electrodes forming said pair of said X-direction electrodes and said pair of said Y-direction electrodes.

3. An insolation detection system comprising:
   an insolation sensor having a light shade with a transmission hole disposed therein to transmit a solar beam as a spot onto a position detection element disposed in a spaced-apart relationship with said light shade, the position detection element outputting electrical signals, on a pair of X-direction electrodes and on a pair of Y-direction electrodes, corresponding to a position of a solar beam irradiated through said transmission hole and corresponding to the intensity of the solar beam;
   irradiation direction determining means, connected to said pairs of X-direction and Y-direction electrodes, for determining the irradiation direction of said solar beam on the basis of a ratio of current values output from said pair of said X-direction electrodes and a ratio of current values output from said pair of said Y-direction electrodes; and
   irradiation intensity determining means, connected to said pairs of X-direction and Y-direction electrodes, for determining an intensity of said solar beam irradiation by summing up currents flowing through one of a pair of said electrodes, selected from said X-direction electrodes and said Y-direction electrodes.

4. The system of claim 3, said system further comprising:
   a housing substantially enclosing said position detection element, said housing having a surface defining a window on an upper face thereof, said light shade being disposed within said window;
   wherein said surface defining said window has an inclined edge to allow solar beams of relatively low altitude to irradiate said position detection element.

5. The system of claim 3, said position detection element comprising:
   a transparent X-direction resistor film,
   a photoelectric conversion film disposed on said X-direction resistor film, for generating a photocurrent by means of photoelectromotive force occurring at a portion of said photoelectric conversion film irradiated by said solar beam,
   a Y-direction resistor film disposed on said photoelectric conversion film,
   said pair of X-direction electrodes disposed at both end portions of said X-direction resistor film opposing each other, and having a resistance value lower than that of said X-direction resistor film, and said pair of Y-direction electrodes disposed at both end portions of said Y-direction resistor film in a direction orthogonally crossing said X-direction electrodes, and having a resistance value lower than that of said Y-direction resistor film.

6. The system of claim 5, wherein said transparent X-direction resistor film is made of a material selected from the group consisting of $SnO_2$, ZnO, and ITO.

7. The system of claim 5, wherein said transparent X-direction resistor film has a sheet resistance value in the range 10 Ω to 1 mΩ.

8. The system of claim 5, wherein said Y-direction resistor film is made of a material selected from the group consisting of Ti, Cr, Ni, TiN, and Cu.

9. The system of claim 5, wherein said Y-direction resistor film has a sheet resistance in the range 10 Ω to 1 mΩ.

10. The system of claim 5, wherein said photoelectric conversion film has an irradiated resistance value in the range 1 kΩ to 500 kΩ.

11. The system of claim 5, wherein said photoelectric conversion film is a diode permitting a current flow from said Y-direction resistor film to said X-direction resistor film at a position where said solar beam irradiates said position detection element.

12. The system of claim 5, said photoelectric conversion film comprising:

a semiconductor layer of a first conductivity type contacting said transparent X-direction resistor film;

an i-type semiconductor layer contacting a side of said first conductivity type semiconductor layer opposite said transparent resistor film; and a semiconductor layer of a second conductivity type contacting said Y-direction resistor film and contacting a side of said i-type semiconductor layer opposite said first conductivity type semiconductor layer.

13. The system of claim 12, wherein said first conductivity type is a p-type conductivity type, and said second conductivity type is an n-type conductivity type.

14. The system of claim 5, wherein said photoelectric conversion film is a pair of series-connected diodes of opposite polarity.

15. The system of claim 5, wherein said photoelectric conversion film comprises:

a first semiconductor layer of a first conductivity type contacting said transparent resistor film;

a first i-type semiconductor layer contacting a side of said first conductivity type semiconductor layer opposite said transparent resistor film;

a semiconductor layer of a second conductivity type contacting a side of said first i-type semiconductor opposite said first conductivity type first semiconductor layer;

a second i-type semiconductor layer contacting a side of said second conductivity type semiconductor layer opposite said first i-type semiconductor layer; and a semiconductor layer of said first conductivity type contacting a side of said second i-type semiconductor opposite said second conductivity type semiconductor layer.

16. The system of claim 15, wherein said first conductivity type is a p-type conductivity type, and said second conductivity type is an n-type conductivity type.

17. The system of claim 3, said position detection element comprising:

a transparent resistor film, a photoelectric conversion film disposed on said transparent resistor film, for generating a photo current by means of photoelectromotive force occurring at a position of said photoelectric conversion film irradiated by said solar beam, a common electrode disposed on said photoelectric conversion film, a pair of X-direction electrodes disposed at both end portions of said resistor film opposing each other, and having a resistance value lower than that of said resistor film, and a pair of Y-direction electrodes disposed at both end portions of said resistor film different from said both end portions in a direction orthogonally crossing a pair of said X-direction electrodes, and having a resistance value lower than that of said resistor film.

18. The system of claim 17, wherein said photoelectric conversion film is a diode permitting a current flow from said common electrode to said transparent resistor film at a position where said solar beam irradiates said position detection element.

19. The system of claim 17, said photoelectric conversion film comprising:

a semiconductor layer of a first conductivity type contacting said transparent resistor film;

an i-type semiconductor layer contacting a side of said first conductivity type semiconductor layer opposite said transparent resistor film; and a semiconductor layer of a second conductivity type contacting said common electrode and contacting a side of said i-type semiconductor layer opposite said first conductivity type semiconductor layer.

20. The system of claim 19, wherein said first conductivity type is a p-type conductivity type, and said second conductivity type is an n-type conductivity type.

21. The system of claim 17, wherein said photoelectric conversion film is a pair of series-connected diodes of opposite polarity.

22. The system of claim 17, wherein said photoelectric conversion film comprises:

a first semiconductor layer of a first conductivity type contacting said transparent resistor film;

a first i-type semiconductor layer contacting a side of said first conductivity type semiconductor layer opposite said transparent resistor film;

a semiconductor layer of a second conductivity type contacting a side of said first i-type semiconductor opposite said first conductivity type first semiconductor layer;

a second i-type semiconductor layer contacting a side of said second conductivity type semiconductor layer opposite said first i-type semiconductor layer; and a semiconductor layer of said first conductivity type contacting a side of said second i-type semiconductor opposite said second conductivity type semiconductor layer.

23. The system of claim 22, wherein said first conductivity type is a p-type conductivity type, and said second conductivity type is an n-type conductivity type.

* * * * *